(12) United States Patent
Masahiro et al.

(10) Patent No.: US 12,245,498 B2
(45) Date of Patent: Mar. 4, 2025

(54) ORGANOIRIDIUM COMPLEX FOR ORGANIC ELECTROLUMINESCENT ELEMENTS

(71) Applicants: TANAKA KIKINZOKU KOGYO K.K., Tokyo (JP); UNIVERSITY PUBLIC CORPORATION OSAKA, Osaka (JP)

(72) Inventors: Yasushi Masahiro, Tokyo (JP); Junichi Taniuchi, Tsukuba (JP); Shigeyuki Yagi, Sakai (JP)

(73) Assignees: TANAKA KIKINZOKU KOGYO K.K., Tokyo (JP); UNIVERSITY PUBLIC CORPORATION OSAKA, Osaka (JP)

( * ) Notice: Subject to any disclaimer, the term of this patent is extended or adjusted under 35 U.S.C. 154(b) by 787 days.

(21) Appl. No.: 17/426,082

(22) PCT Filed: Jan. 28, 2020

(86) PCT No.: PCT/JP2020/002862
§ 371 (c)(1),
(2) Date: Jul. 27, 2021

(87) PCT Pub. No.: WO2020/158689
PCT Pub. Date: Aug. 6, 2020

(65) Prior Publication Data
US 2022/0093879 A1    Mar. 24, 2022

(30) Foreign Application Priority Data

Jan. 30, 2019 (JP) ................. 2019-014064

(51) Int. Cl.
*H10K 85/30* (2023.01)
*C07F 15/00* (2006.01)
(Continued)

(52) U.S. Cl.
CPC ....... *H10K 85/342* (2023.02); *C07F 15/0033* (2013.01); *C09K 11/06* (2013.01);
(Continued)

(58) Field of Classification Search
CPC .. H10K 85/342; H10K 2101/10; H10K 50/11; C07F 15/0033; C09K 11/06; C09K 2211/1037
(Continued)

(56) References Cited

U.S. PATENT DOCUMENTS

| | | |
|---|---|---|
| 2012/0292601 A1 | 11/2012 | Kottas et al. |
| 2014/0303370 A1 | 10/2014 | Kottas et al. |

(Continued)

FOREIGN PATENT DOCUMENTS

| | | |
|---|---|---|
| CN | 104557998 A | 4/2015 |
| CN | 107973823 A | 5/2018 |

(Continued)

OTHER PUBLICATIONS

Office Action issued in corresponding Chinese Patent Application No. 202080011758.9 dated Oct. 31, 2023 (17 pages).
(Continued)

*Primary Examiner* — Anita Nassiri-Motlagh
(74) *Attorney, Agent, or Firm* — Foley & Lardner LLP

(57) ABSTRACT

The present invention relates to an organoiridium complex for an organic electroluminescent element in which a C—N ligand and an ancillary ligand are coordinated with iridium. This organoiridium complex contains a 2-(dibenzo[b,d]thiophen-4-yl)quinolinate ligand having at least one methyl group introduced thereinto coordinated as the C—N ligand, and is represented by the following Formula. The present inventive organoiridium complex is suitable as a red emitting phosphorescent material for an OLED, has high pho-
(Continued)

toluminescence quantum yield $\Phi_{PL}$, and is excellent in color purity.

[Chemical Formula 1]

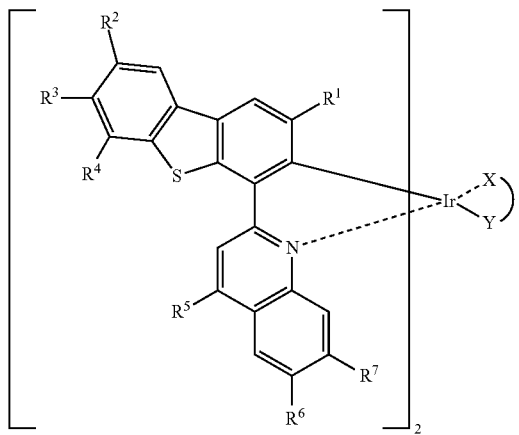

(In the aforementioned Formula, $R^1$, $R^2$, $R^3$, $R^4$, $R^5$, $R^6$, and $R^7$ are each a methyl group or a hydrogen atom, provided that at least one of $R^1$, $R^2$, $R^3$, $R^4$ is a methyl group; and X—Y is the ancillary ligand.)

19 Claims, 5 Drawing Sheets

(51) Int. Cl.
*C09K 11/06* (2006.01)
*H10K 50/11* (2023.01)
*H10K 101/10* (2023.01)

(52) U.S. Cl.
CPC ............... *C09K 2211/1037* (2013.01); *C09K 2211/185* (2013.01); *H10K 50/11* (2023.02); *H10K 2101/10* (2023.02)

(58) Field of Classification Search
USPC ................................................ 252/301.16
See application file for complete search history.

(56) References Cited

U.S. PATENT DOCUMENTS

2017/0200907 A1  7/2017  Masahiro et al.
2018/0273563 A1  9/2018  Choi et al.

FOREIGN PATENT DOCUMENTS

| JP | 2008-222635 A | 9/2008 |
| JP | 2014-516965 A | 7/2014 |
| JP | 2016-015468 A | 1/2016 |
| WO | WO-2013/174471 A1 | 11/2013 |

OTHER PUBLICATIONS

Office Action issued in corresponding German Patent Application No. 112020000607.7 dated Oct. 17, 2023 (7 pages).
Shimizu et al., "Copper-Catalyzed Double S-Arylation of Potassium Thioacetate with Dibenziodolium Triflates: Facile Synthesis of Unsymmetrical Dibenzothiophenes", European Journal of Organic Chemistry, May 23, 2016, pp. 2785-2788.
Wang et al., "Construction of Functionalized Annulated Sulfone via $SO_2$/I Exchange of Cyclic Diaryliodonium Salts", American Chemistry Society, Organic Letters, Sep. 6, 2017, pp. 4916-4919.
Stokes et al., "$Rh_2$ (II)-Catalyzed Synthesis of Carbazoles from Biaryl Azides," The Journal of Organic Chemistry, vol. 74, 2009, pp. 3225-3228.
International Searching Authority, "International Search Report," issued in connection with International Patent Application No. PCT/JP2020/002862, dated Apr. 14, 2020.
International Searching Authority, "Written Opinion," issued in connection with International Patent Application No. PCT/JP2020/002862, dated Apr. 14, 2020.
Office Action issued in corresponding Korean Patent Application No. 10-2021-7021475 dated Aug. 28, 2023 (14 pages).
Office Action issued in corresponding Korean Patent Application No. 10-2021-7021475 dated Nov. 8, 2023 (9 pages).
Office Action issued in corresponding Chinese Patent Application No. 202080011758.9 dated May 24, 2024 (15 pages).
Office Action issued in corresponding Korean Patent Application No. 10-2021-7021475 dated Mar. 22, 2024 (10 pages).

ORGANOIRIDIUM COMPLEX FOR ORGANIC ELECTROLUMINESCENT ELEMENTS

CROSS-REFERENCE TO RELATED APPLICATIONS

The present application claims priority under 37 U.S.C. § 371 to International Patent Application No. PCT/JP2020/002862, filed Jan. 28, 2020, which claims priority to and the benefit of Japanese Patent Application No. 2019-014064, filed on Jan. 30, 2019. The contents of these applications are hereby incorporated by reference in their entireties.

TECHNICAL FIELD

The present invention relates to a technique that provides an organoiridium complex suitable as a phosphorescent material for an organic electroluminescent element. Particularly, it relates to an organoiridium complex useful as a red phosphorescent material, having a high photoluminescence quantum yield ($\Phi_{PL}$), and excellent in color purity.

BACKGROUND ART

Technical development of an organic electroluminescent element (OLED) is expected as next-generation displays and lighting. As the characteristics, the OLED has advantages that power consumption is small, that it enables to produce a thinner device, that a response speed is excellent, that images can be clearly displayed in both dark and bright places, and the like. FIG. 7 is a diagram explaining an example of the structure of the OLED. In the example of FIG. 7, the OLED basically has a multilayer structure of a cathode/electron transport layer/emission layer/hole transport layer/anode/glass substrate. In recent years, there is proposed an element having this basic structure to which a functional layer for improving the light emission property, such as a hole (electron) injection layer, a buffer layer, or an interlayer insulating film is appropriately added.

In the emission layer of the OLED having the aforementioned structure, various types of emitting materials are used. Here, the emitting materials of the OLED are roughly divided into fluorescent materials and phosphorescent materials, and in recent years, the development of novel materials of the phosphorescent materials is proceeding. This is because an emitting material is required to have high emission efficiency to cope with power saving, and a phosphorescent material can meet such a requirement based on the emission principle thereof as compared with a fluorescent material. Although various organic compounds have been studied as the phosphorescent materials for the OLED, studies are principally made on a phosphorescent material made of an organometallic complex containing, as a central metal, a noble metal such as platinum or iridium in recent years.

Here, in study of application of the OLED to a display or the like, an example of significant items to be studied on a phosphorescent material includes the purity of luminescent color thereof. In the OLED, all colors can be expressed by control of emission intensities of emission of the three primary colors of light of red (R), green (G), and blue (B), from emitting materials. In order to appropriately express the colors, a desired luminescent color is required to be emitted with high purity and high efficiency. In this point, according to the present inventors, a phosphorescent material exhibiting red light emission, which has the longest light emission wavelength, tends to have a low photoluminescence quantum yield ($\Phi_{PL}$), and hence is a material of high interest as compared with the other luminescent colors.

Note that the photoluminescence quantum yield $\Phi_{PL}$ quantum efficiency ($\Phi_{PL}$) is one factor related to the quantum efficiency of an emitting material. When the quantum efficiency of an emitting material is roughly divided into "external quantum efficiency" and "internal quantum efficiency", the PL quantum efficiency is a factor determining the internal quantum efficiency. An emitting material is required to be improved in the internal quantum efficiency, and for this purpose, high PL quantum efficiency is aimed for.

As described above, many reports have been made on organometallic complexes of noble metals such as platinum and iridium as the phosphorescent materials. In addition, some reports have been made on red phosphorescent organic iridium exhibiting red light emission. The present applicant also discloses some related prior techniques on red phosphorescent organic iridium. As such red phosphorescent organic iridium, an organometallic complex in which a ligand (C—N ligand) including a heterocyclic ring and having a C—N structure, and a diketonate-based ancillary ligand (β-diketone-based ligand) are coordinated with iridium used as the central metal has been proposed.

Specifically, PTL 1 discloses an iridium complex represented by the following Formula 1 in which 1-(dibenzo[b,d]furan-4-yl)isoquinolinate is applied as the C—N ligand, and dibenzoylmethanate having a butyloxy group introduced thereinto is coordinated as the diketonate-based ancillary ligand. Besides, PTL 2 discloses an iridium complex represented by the following Formula 2 in which 2-(dibenzo[b,d]thiophen-4-yl)quinolinate is applied as the C—N ligand, and dibenzoylmethanate having a tert-butyl group introduced thereinto is coordinated as the diketonate-based ancillary ligand.

[Chemical Formula 1]

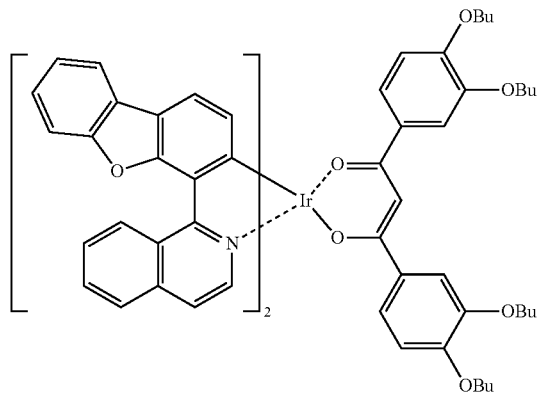

-continued

[Chemical Formula 2]

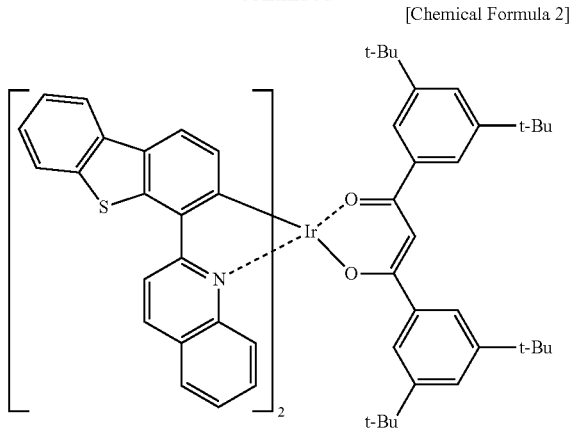

[Chemical Formula 2]

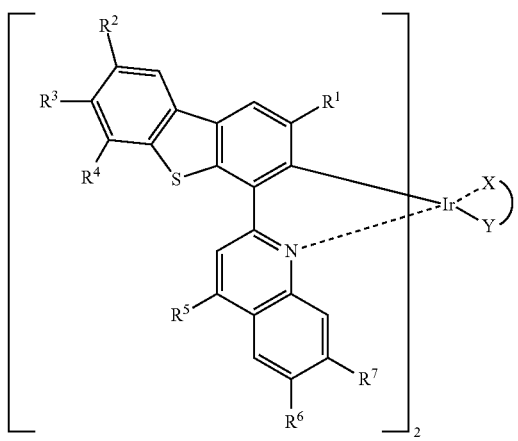

CITATION LIST

Patent Literature

PTL 1: Japanese Patent Laid-Open Publication No. 2008-222635
PTL 2: Japanese Patent Laid-Open Publication No. 2016-15468

SUMMARY OF INVENTION

Technical Problem

The conventional organoiridium complexes described above are both phosphorescent materials exhibiting luminescent colors that can be sorted as red. These organoiridium complexes are, however, not satisfactory in both the emission efficiency (photoluminescence quantum yield ($\Phi_{PL}$)) and the color purity. Specifically, the organoiridium complex of PTL 1 has a light emission wavelength ($\lambda_{PL}$) in a polymethyl methacrylate thin film (PMMA thin film) of 635 nm, and hence can emit light of substantially pure red color. The $\Phi_{PL}$ is, however, as low as 0.17, and hence is insufficient from the viewpoint of emission efficiency. On the other hand, the organoiridium complex of PTL 2 has a comparatively high $\Phi_{PL}$ of 0.61 in a PMMA thin film, but the light emission wavelength ($\lambda_{PL}$) is 612 nm, and hence it emits light of a shorter wavelength than that of a pure red color.

As known from the organoiridium complexes described in PTLs 1 and 2, it is difficult, regarding a red emitting phosphorescent material, to improve the photoluminescence quantum yield ($\Phi_{PL}$) with a pure red color retained and with excellent color purity. In the present circumstances, there is no red emitting phosphorescent material well balanced in these properties.

The present invention was achieved against the above backgrounds, and is aimed at an organoiridium complex that is suitable as a red emitting phosphorescent material for an OLED, has a high photoluminescence quantum yield ($\Phi_{PL}$), and is excellent in color purity. In addition, the organoiridium complex is also characterized by a synthesis process thereof as described below. The present invention also discloses a method for effectively producing the organoiridium complex.

Solution to Problem

For solving the aforementioned problems, the present inventors studied an effect of an organoiridium complex using, as a C—N ligand, a derivative of 2-(dibenzo[b,d]thiophen-4-yl)quinolinate. Specifically, an organoiridium complex in which a methyl group is introduced as a substituent in a specific position in 2-(dibenzo[b,d]thiophen-4-yl)quinolinate was studied. As a result, it was found that a highly efficient pure red phosphorescent organoiridium complex as compared with conventional organic iridium can be obtained, and thus, the present invention was conceived.

The present invention solving the aforementioned problems is an organoiridium complex for an organic electroluminescent element containing a C—N ligand and an ancillary ligand coordinated with iridium, and represented by the following Formula, in which a 2-(dibenzo[b,d]thiophen-4-yl)quinolinate ligand having at least one methyl group introduced thereinto is coordinated as the C—N ligand.

[Chemical Formula 3]

(In the aforementioned Formula, $R^1$, $R^2$, $R^3$, $R^4$, $R^5$, $R^6$, and $R^7$ are each a methyl group or a hydrogen atom, provided that at least one of $R^1$, $R^2$, $R^3$, $R^4$ is a methyl group; and X—Y is an ancillary ligand.)

The present invention will now be described in detail. The characteristics of the present inventive red phosphorescent organoiridium complex lies in that a methyl group is introduced into 2-(dibenzo[b,d]thiophen-4-yl)quinolinate used as the C—N ligand. It is characterized in particular in that at least one methyl group is introduced into a specific position in a dibenzothiophene moiety of the C—N ligand.

One cause of deterioration of the PL quantum efficiency $\Phi_{PL}$ of a phosphorescent material including an organoiridium complex having a C—N ligand is heat inactivation of a molecule. One cause of the heat inactivation is stretching vibration occurring in an aromatic C—H bond of the C—N ligand. In the present invention, the C—H bond causing the stretching vibration with high energy is replaced with a C—C bond with low energy by introducing a methyl group (—CH$_3$) into a specific position (C—H bond) in the C—N ligand. Thus, inactivation through vibration is suppressed so that the $\Phi_{PL}$ can be improved. In addition, the present inventors presume that an energy difference between a highest occupied molecular orbital (HOMO) and a lowest unoccupied molecular orbital (LUMO) of a complex molecule is changed by introducing a methyl group into the C—N ligand, which shifts the light emission wavelength $\lambda_{PL}$ to a long wavelength side to exhibit pure red phosphorescence.

In this manner, in the present invention, a suitable red phosphorescent organoiridium complex is constructed by introducing a methyl group into a specific moiety, namely, the 2'-position (R$^1$), the 6'-position (R$^2$), the 7'-position (R$^3$), or the 8'-position (R$^4$), in 2-(dibenzo[b,d]thiophen-4-yl)quinolinate used as the C—N ligand, so as to improve the $\Phi_{PL}$ and increase the $\lambda_{PL}$.

As the methyl group introduction into 2-(dibenzo[b,d]thiophen-4-yl)quinolinate in the present inventive organoiridium complex, methyl group (R$^5$, R$^6$, R$^7$) introduction into a quinoline moiety is also useful in addition to the methyl group introduction into a dibenzothiophene moiety. It is presumed that inactivation due to the stretching vibration in the aromatic C—H bond described above occurs also in the quinoline moiety, and hence, the $\Phi_{PL}$ can be expected to be improved by replacing the C—H bond with a C—C bond.

As described so far, in the present inventive organoiridium complex, the methyl group introduction into the dibenzothiophene moiety of 2-(dibenzo[b,d]thiophen-4-yl)quinolinate is essential. Examples of preferable embodiments of the present invention include an embodiment in which a methyl group is introduced into the 2'-position alone (R$^1$=methyl group, R$^2$, R$^3$, R$^4$=hydrogen), an embodiment in which a methyl group is introduced into the 2'- and 7'-positions (R$^1$, R$^3$=methyl group, R$^2$, R$^4$=hydrogen), an embodiment in which a methyl group is introduced into the 6'- and 8'-positions (R$^2$, R$^4$=methyl group, R$^1$, R$^3$=hydrogen), and an embodiment in which a methyl group is introduced into the 2'-, 6'- and 8'-positions (R$^1$, R$^2$, R$^4$=methyl group, R$^3$=hydrogen). Among these embodiments, the embodiments in which a methyl group is essentially introduced into the 2'-position (R$^1$=methyl group, R$^2$ to R$^4$=either hydrogen or methyl group) is particularly preferred.

In the present inventive organoiridium complex, preferable examples of the ancillary ligand (X—Y ligand) coordinated with iridium together with the C—N ligand include the following. Although the ancillary ligand does not directly contribute to improvement of light emission properties of the organoiridium complex, it causes variation to some extent. The following ligands have a low molecular weight, and have the aforementioned action as the ancillary ligand.

[Chemical Formula 4]

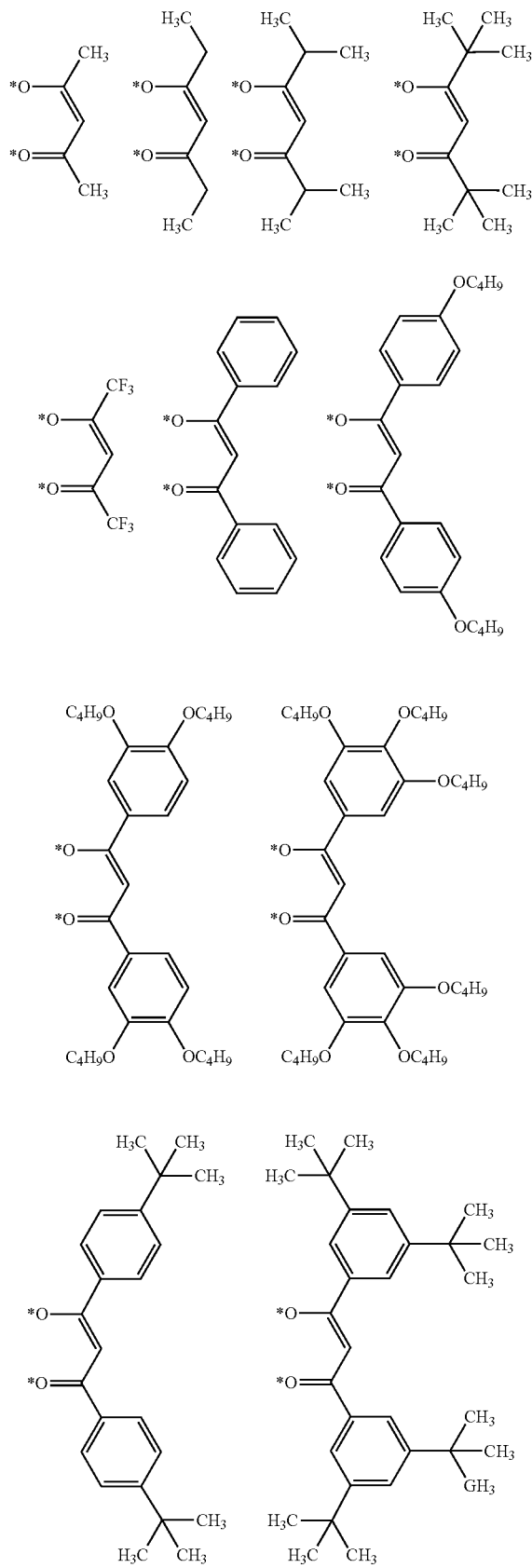

-continued

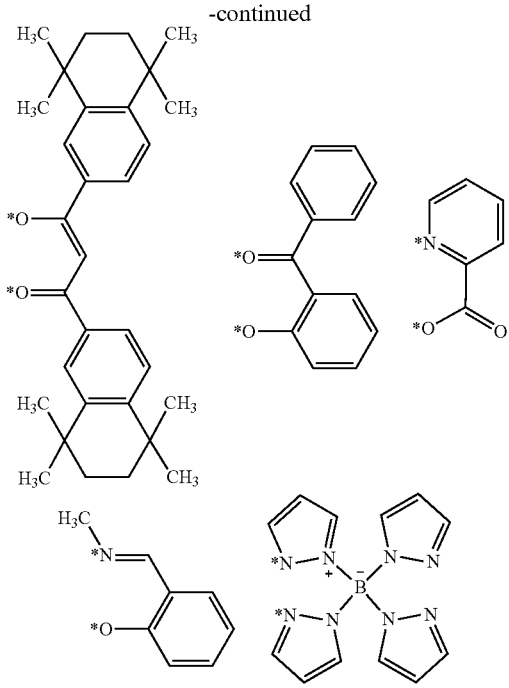

(In the aforementioned formulas, an atom marked with * corresponds to a coordinating atom coordinated with an iridium atom.)

In the aforementioned ancillary ligands, a more preferable ligand is acetylacetone(2,4-pentanedione) or dipivaloyl methane (2,2,6,6-tetramethyl-3,5-heptadione), that is, a β-diketone ligand. A most preferable ligand is dipivaloyl methane. As described above, the ancillary ligand does not directly contribute to the improvement of light emission properties of the organoiridium complex. For achieving the object of the present invention, however, the ancillary ligand is preferably optimized. From this point of view, dipivaloyl methane is optimal as the ancillary ligand. Dipivaloyl methane is a ligand having larger steric hindrance than acetyl acetone. In light emission in a solid medium such as an OLED, it is preferable that radiationless deactivation due to intermolecular interaction can be reduced, and for this purpose, a ligand having large steric hindrance, such as dipivaloyl methane, is suitably used as the ancillary ligand.

[Chemical Formula 5]

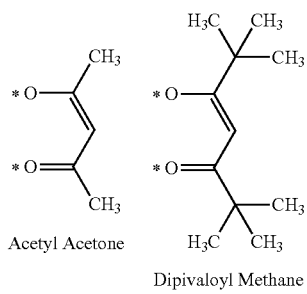

Acetyl Acetone

Dipivaloyl Methane (In the aforementioned formulas, an atom marked with * corresponds to a coordinating atom coordinated with an iridium atom.)

The present inventive red phosphorescent organoiridium complex described so far is excellent in color purity and higher in emission efficiency as compared with a conventional organoiridium complex. Therefore, it is useful as an emission layer of an OLED. An emission layer can be formed by doping this organoiridium complex in a polymer thin film.

Hereinafter, a method for producing the present inventive organoiridium complex will be explained. Regarding a synthesis method for an organoiridium complex in which a C—N ligand and an ancillary ligand such as a β-diketone compound are coordinated with iridium as in the present invention, the outline of the production method is known. Specifically, an iridium salt and a nitrogen-containing compound that constitutes the C—N ligand are first reacted with each other by heating to obtain a precursor, and then the precursor and the ancillary ligand (such as a β-diketone compound) are reacted with each other by heating, and thus the organoiridium complex can be synthesized. Alternatively, instead of the aforementioned procedures, the organoiridium complex can be synthesized by first reacting an iridium salt with the ancillary ligand, and then reacting with the nitrogen-containing compound (the C—N ligand).

Also to the present inventive organoiridium complex, the aforementioned synthesis process is applied. The present invention is characterized in, however, that a methyl group is introduced into a specific position (the 2'-position, the 6'-position, the 7'-position, the 8'-position) of 2-(dibenzo[b,d]thiophen-4-yl)quinolinate used as the C—N ligand.

In this point, synthesis of unsubstituted 2-(dibenzo[b,d]thiophen-4-yl)quinolinate is comparatively easy and known. For example, dibenzo[b,d]thiophene-4-boronic acid, which is used as a starting material, is cross-coupled to a quinoline halide to synthesize 2-(dibenzo[b,d]thiophen-4-yl)quinoline. Dibenzo[b,d]thiophene-4-boronic acid used as the starting material is commercially available, and hence the nitrogen-containing compound to be used as the C—N ligand can be easily synthesized.

On the contrary, no report has been made on synthesis of the present inventive organoiridium complex, namely, 2-(dibenzo[b,d]thiophen-4-yl)quinoline having a methyl group introduced into a specific position thereof.

From the stage where the introduction of a methyl group into a 2-(dibenzo[b,d]thiophen-4-yl)quinolinate ligand, which is the subject matter of the present invention was conceived, the present inventors have been continuing earnest studies on the synthesis method. As a specific method, the following process was found regarding synthesis of the C—N ligand.

In the present inventive synthesis process, dibromoaniline or a dibromoaniline derivative having a methyl group introduced thereto is used as a starting material. The process includes a step of obtaining an intermediate 1 including a biphenylamine derivative by Suzuki-Miyaura cross-coupling reaction between the dibromoaniline (derivative) and phenylboronic acid or a phenylboronic acid derivative having a methyl group; and a step of synthesizing an intermediate 2 by iodinating an amino group of the intermediate 1. The process further includes a step of synthesizing an intermediate 3 that is a cyclic dibenzo iodonium compound by oxidizing the intermediate 2 with peroxo acid such as methachloroperbenzoic acid. The synthesis of the intermediate 3 is a characteristic step in the synthesis method of the present invention.

Then, the intermediate 3 is reacted with thioacetate to synthesize an intermediate 4 that is a bromodibenzothiophene derivative, and the intermediate 4 is subject to lithiation, reacted with boronic acid ester, and hydrolyzed to synthesize an intermediate 5 that is a dibenzothiophene-boronic acid derivative having one or more methyl groups introduced thereinto. The dibenzothiophene derivative having multiple methyl substitution thus generated as the intermediate 5 is a novel substance, and can be a characteristic of the complex synthesis method of the present invention together with the synthesis of the intermediate 3 described above.

After the synthesis of the dibenzothiophene-boronic acid derivative as the intermediate 5, the process is performed in the same manner as in the synthesis method of an unsubstituted 2-(dibenzo[b,d]thiophen-4-yl)quinolinate ligand. Specifically, through Suzuki-Miyaura cross-coupling reaction between the intermediate 5 and 2-chloroquinoline, the 2-(dibenzo[b,d]thiophen-4-yl)quinolinate ligand having a methyl group introduced thereinto, that is, the C—N ligand of the present invention, can be synthesized.

When a C—N ligand in which a methyl group is introduced into a quinoline moiety is to be synthesized, the desired C—N ligand can be synthesized by reacting the intermediate 5 with 2-chloroquinoline or a 2-chloroquinoline derivative (such as 2-chloro-4-methylquinoline). As the 2-chloroquinoline derivative, a commercially available product or a compound synthesized by a known method can be applied.

In this manner, in the present invention, the C—N ligand, which is the 2-(dibenzo[b,d]thiophen-4-yl)quinolinate ligand having a substituent introduced thereinto, is synthesized through the synthesis of the intermediates 1 to 5. Such a reaction route is applied in order to synthesize a C—N ligand in which a methyl group is introduced into an aimed position. In the present inventive synthesis process, a target compound can be obtained without concerning about problems of isomerization and position selectivity. Since an emitting material for an OLED is required of high purity, the method of the present invention free from fear of purity deterioration due to isomerization is greatly advantageous.

Then, after the C—N ligand having a methyl group introduced thereinto is synthesized, a precursor is synthesized by reacting an iridium salt with the C—N ligand by heating as described above, the precursor is further reacted with an ancillary ligand, and thus, the present inventive organoiridium complex can be produced. The C—N ligand may be reacted after an iridium salt is reacted with an ancillary ligand first.

The heating reaction for synthesizing the above precursor is performed preferably at 80° C. to 130° C. for 12 to 24 hours. The heating reaction with the ancillary ligand is performed preferably at 60° C. to 130° C. for 0.5 to 12 hours. These reactions are performed preferably in the presence of a solvent.

The present inventive organoiridium complex explained so far is useful as a light emitting dopant of an emission layer of an OLED. The emission layer is constructed by appropriately mixing components such as an electron transport material and a hole-transporting host material in addition to the present inventive organoiridium complex. The emission layer is formed appropriately by a method such as a spin coating method or a vacuum deposition method.

Advantageous Effects of Invention

A present inventive organoiridium complex is higher in a PL quantum yield and heat resistance than conventional complexes, and is suitable as an emitting material of an OLED.

DESCRIPTION OF EMBODIMENTS

Figure 1:
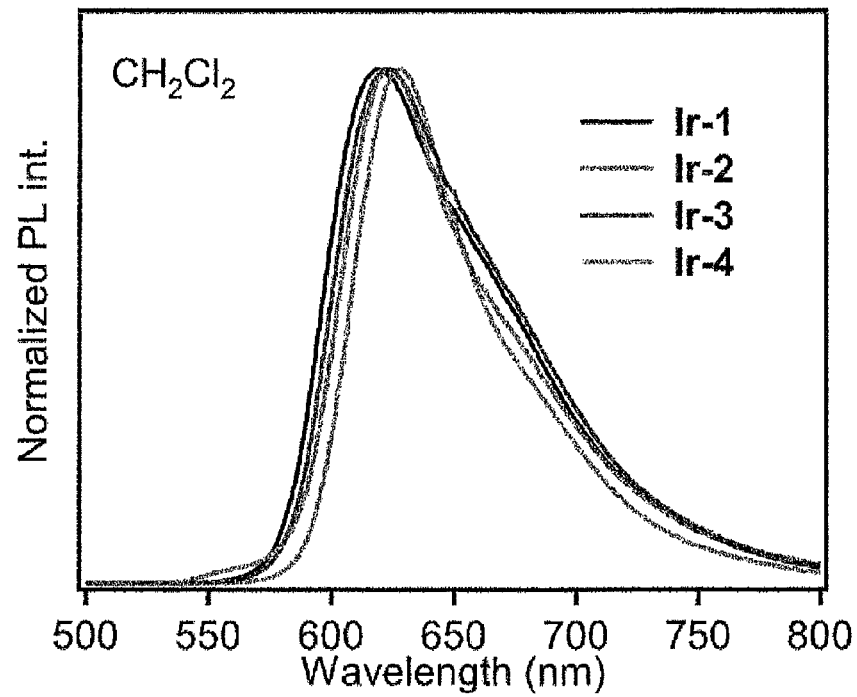
FIG. 1 is a diagram of emission spectrum in a dichloromethane solution of organoiridium complexes Ir-1 to Ir-4 synthesized in the present embodiment.

Embodiments of the present invention will now be explained. In the present embodiment, the following four types of organoiridium complexes in which 2-(dibenzo[b,d]thiophen-4-yl)quinolinate and a derivative thereof were coordinated as C—N ligands, and dipivaloyl methane (2,2,6,6-tetramethyl-3,5-heptadione) was coordinated as an ancillary ligand were synthesized, and their light emission properties were evaluated. Among the following four types of organoiridium complexes, Ir-1 using, as the C—N ligand, unsubstituted 2-(dibenzo[b,d]thiophen-4-yl)quinolinate is a conventional organoiridium complex corresponding to a comparative example. On the other hand, Ir-2, Ir-3, and Ir-4 in each of which a methyl group is introduced into a dibenzothiophene moiety of 2-(dibenzo[b,d]thiophen-4-yl)quinolinate are organoiridium complexes according to the present embodiment.

[Chemical Formula 6]

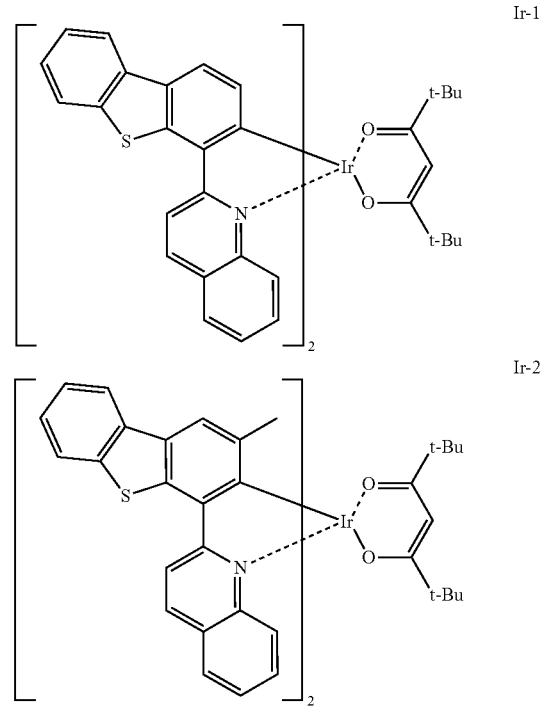

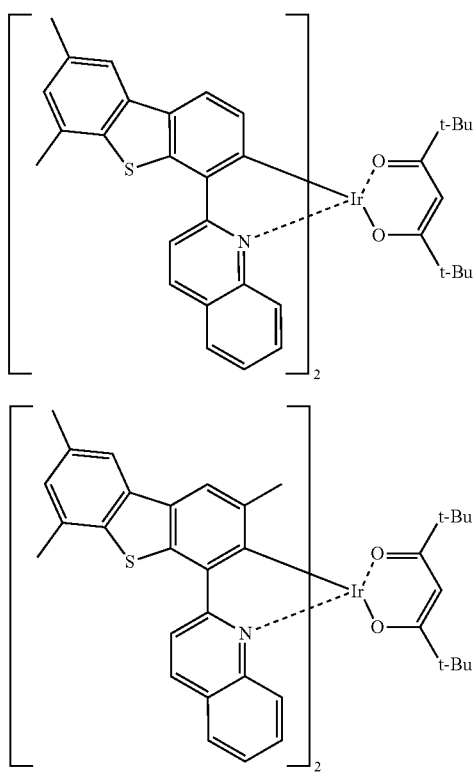

(1) Synthesis of Organoiridium Complexes (Ir-1 to Ir-4)

In synthesis of the above organoiridium complexes, synthesis (i) of the C—N ligands (C—N ligands (1) to (4)) was performed, and then synthesis (ii) of precursors (precursors (1) to (4)) was performed by reacting the C—N ligands with an iridium salt (iridium chloride). Then, the precursors were reacted with dipivaloyl methane used as the ancillary ligand to synthesize the organoiridium complexes (Ir-1 to Ir-4).

Synthesis scheme for the organoiridium complexes (Ir-1 to Ir-4) employed in the present embodiment is as follows. In the following scheme, the organoiridium complex (Ir-1) of the conventional example was synthesized by synthesizing the C—N ligand (1) using, as a starting material, commercially available dibenzothiophene-boronic acid, and thereafter, the organoiridium complex (Ir-1) was synthesized through synthesis of the precursor (1).

On the other hand, with respect to the organoiridium complexes (Ir-2 to Ir-4) according to the present embodiment, a dibromoaniline derivative was used as a starting material to successively synthesize intermediates 1a to 1c, intermediates 2a to 2c, intermediates 3a to 3c, intermediates 4a to 4c, and intermediates 5a to 5c, and thus the C—N ligands (2) to (4) were synthesized. Then, in the same manner as Ir-1, precursors (2) to (4) were synthesized to synthesize the organoiridium complexes (Ir-2 to Ir-4).

[Chemical Formula 7]

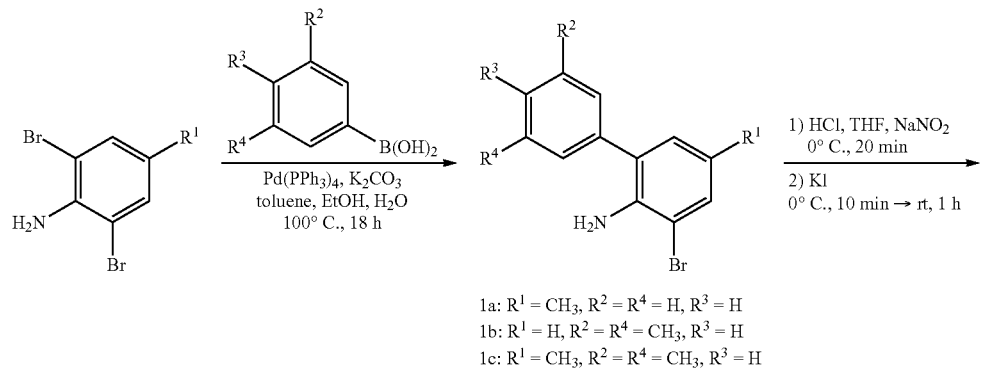

1a: $R^1 = CH_3$, $R^2 = R^4 = H$, $R^3 = H$
1b: $R^1 = H$, $R^2 = R^4 = CH_3$, $R^3 = H$
1c: $R^1 = CH_3$, $R^2 = R^4 = CH_3$, $R^3 = H$

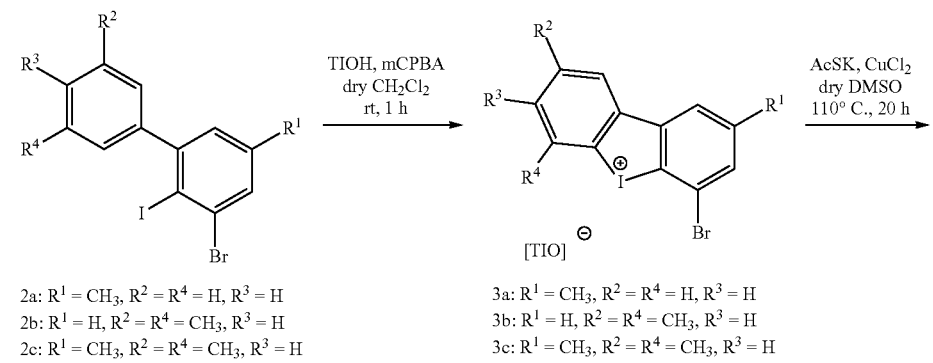

2a: $R^1 = CH_3$, $R^2 = R^4 = H$, $R^3 = H$
2b: $R^1 = H$, $R^2 = R^4 = CH_3$, $R^3 = H$
2c: $R^1 = CH_3$, $R^2 = R^4 = CH_3$, $R^3 = H$

3a: $R^1 = CH_3$, $R^2 = R^4 = H$, $R^3 = H$
3b: $R^1 = H$, $R^2 = R^4 = CH_3$, $R^3 = H$
3c: $R^1 = CH_3$, $R^2 = R^4 = CH_3$, $R^3 = H$

-continued

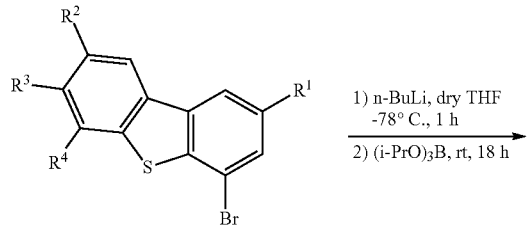

4a: R¹ = CH₃, R² = R⁴ = H, R³ = H
4b: R¹ = H, R² = R⁴ = CH₃, R³ = H
4c: R¹ = CH₃, R² = R⁴ = CH₃, R³ = H 1) n-BuLi, dry THF
   -78° C., 1 h
2) (i-PrO)₃B, rt, 18 h

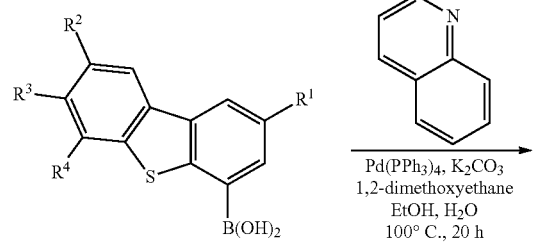

5a: R¹ = CH₃, R² = R⁴ = H, R³ = H
5b: R¹ = H, R² = R⁴ = CH₃, R³ = H
5c: R¹ = CH₃, R² = R⁴ = CH₃, R³ = H

Pd(PPh₃)₄, K₂CO₃
1,2-dimethoxyethane
EtOH, H₂O
100° C., 20 h

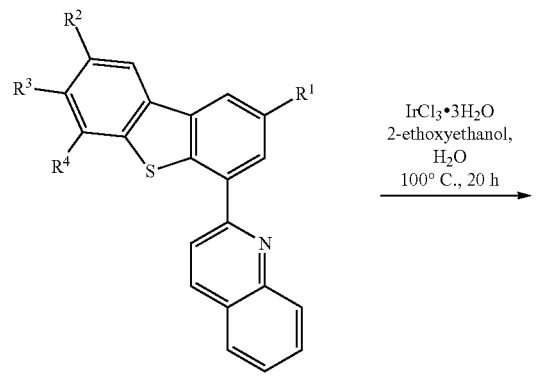

C-N ligand (1): R¹ ~ R⁴ = H
C-N ligand (2): R¹ = CH₃, R² = R⁴ = H, R³ = H
C-N ligand (3): R¹ = H, R² = R⁴ = CH₃, R³ = H
C-N ligand (4): R¹ = CH₃, R² = R⁴ = CH₃, R³ = H IrCl₃·3H₂O
2-ethoxyethanol,
H₂O
100° C., 20 h

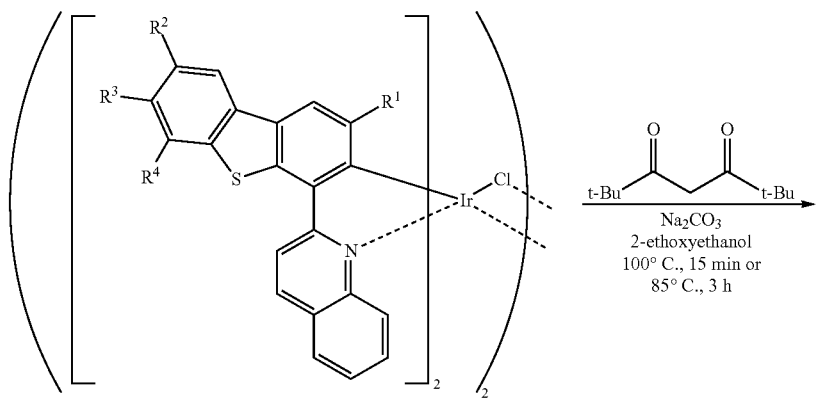

Precursor (1): R¹ ~ R⁴ = H
Precursor (2): R¹ = CH₃, R² = R⁴ = H, R³ = H
Precursor (3): R¹ = H, R² = R⁴ = CH₃, R³ = H
Precursor (4): R¹ = CH₃, R² = R⁴ = CH₃, R³ = H Na₂CO₃
2-ethoxyethanol
100° C., 15 min or
85° C., 3 h -continued

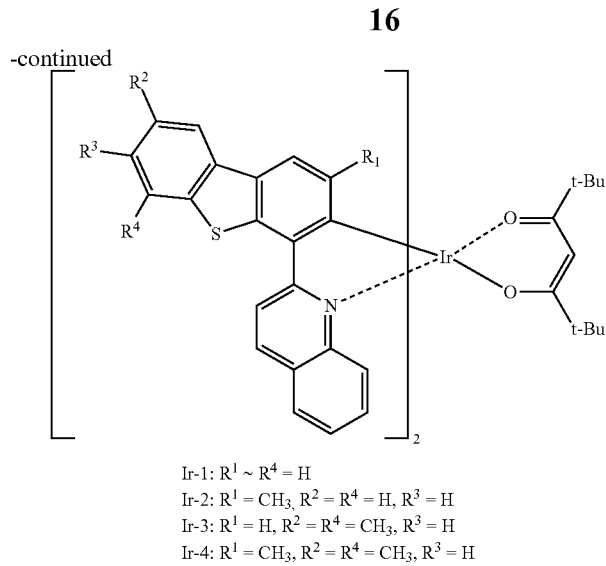

Ir-1: $R^1 \sim R^4 = H$
Ir-2: $R^1 = CH_3, R^2 = R^4 = H, R^3 = H$
Ir-3: $R^1 = H, R^2 = R^4 = CH_3, R^3 = H$
Ir-4: $R^1 = CH_3, R^2 = R^4 = CH_3, R^3 = H$ All of the starting materials, reagents and solvents used in the present embodiment were those having commercially available reagent grades without purification. Commercially available dehydrated THF was purchased and used as dry THF as it was. In addition, a spherical silica gel (neutral) manufactured by Nacalai Tesque, Inc. or a spherical silica gel (neutral) manufactured by Kanto Chemical Co., Inc. was used as a filler to be used for column chromatography.

A proton nuclear magnetic resonance ($^1$H NMR) spectrum and mass analysis (mass (MS) spectrum) were used for identification of the synthesized compounds. JNM-ECX400 spectrophotometer (400 MHz) manufactured by JEOL or JNM-ECS400 spectrophotometer (400 MHz) manufactured by JEOL was used for measurement of the $^1$H NMR spectrum. The MS spectrum was measured by subjecting a sample ionized by matrix-assisted laser desorption/ionization method (MALDI method) to the time-of-flight (TOF) type mass spectrometry (MALDI-TOF-MS spectrum) with α-cyano-4-hydroxycinnamic acid (CHCA) used as a matrix. For the measurement, Shimadzu-Kratos AXIMA-CFR PLUS TOF Mass mass spectrometry analyzer was used. Elemental analysis was performed using JM10 elemental analyzer manufactured by J-Science Lab Co., Ltd. with acetanilide used as a standard substance.

Synthesis of Organoiridium Complex Ir-1
(i) Synthesis of C—N Ligand (1) (2-(dibenzo[b,d]thiophen-4-yl)quinolinate A 1000 mL four-necked round-bottom flask was charged with an aqueous solution of potassium carbonate (8.90 g, 64.4 mmol) dissolved in water (225 mL), and the round-bottom flask was further charged with dibenzo[b,d]thiophen-4-yl boronic acid (4.72 g, 20.7 mmol), 2-chloroquinoline (3.64 g, 22.3 mmol), tetrakis(triphenylphosphine)palladium (0) (0.94 g, 0.813 mmol), 1,2-dimethoxyethane (225 mL), and ethanol (90 mL), followed by heating and stirring for 18 hours at 100° C. under a nitrogen atmosphere. After being allowed to cool, chloroform (200 mL) was added thereto, and the resultant was shaken in a separating funnel to remove an aqueous layer. An organic layer was washed with water (300 mL) and saturated saline (300 mL), and dried on anhydrous magnesium sulfate, and then, the solvent was distilled off with a rotary evaporator. The thus obtained residue was purified by silica gel column chromatography (development solvent: chloroform/hexane, v/v, 4/1). Through this procedure, 5.44 g (17.5 mmol) of 2-(dibenzo[b,d]thiophen-4-yl)quinolinate (C—N ligand (1)) was synthesized. This compound was a white solid, and the yield was 84%.

(ii) Synthesis of Precursor (1)

A 1000 mL four-necked round-bottom flask was charged with the C—N ligand (1) (5.23 g, 16.7 mmol) synthesized as described above, trichloroiridium hydrate (2.95 g, 8.36 mmol), 2-ethoxyethanol (330 mL), and water (65 mL), followed by heating and stirring for 20 hours at 100° C. under a nitrogen atmosphere. After being allowed to cool, a deep red precipitate generated in the reaction system was recovered by suction filtration. Through this procedure, the precursor (1) of the C—N ligand (1) and iridium was synthesized (yield 76% (5.40 g, 3.18 mmol).

(iii) Synthesis of Organoiridium Complex (Ir-1)

A 500 mL three-necked round-bottom flask was charged with the precursor (1) (2.01 g, 1.18 mmol) synthesized as described above, dipivaloyl methane (0.45 mL, 2.29 mmol), sodium carbonate (2.04 g, 19.2 mmol), and 2-ethoxyethanol (300 mL), followed by heating and stirring for 3 hours at 85° C. under a nitrogen atmosphere. After being allowed to cool, dichloromethane (200 mL) and water (200 mL) were added thereto, and the resultant was shaken in a separating funnel to remove an aqueous layer. An organic layer was washed with saturated saline (200 mL), and dried on anhydrous sodium sulfate, and then, the solvent was distilled off with a rotary evaporator. The thus obtained residue was purified by silica gel column chromatography (development solvent: dichloromethane/hexane, v/v, 4/1), and the resultant was washed by adding hexane thereto and stirring the resultant at 75° C., and was recovered by suction filtration to obtain a target compound of the organoiridium complex (Ir-1). The organoiridium complex was a red solid, and the yield was 68% (1.59 g, 1.60 mmol). Besides, properties obtained by NMR and the like of the compound synthesized through the aforementioned procedures were as follows.

$^1$H NMR (400 MHz, CDCl$_3$) δ 0.59 (s, 18H), 4.84 (s, 1H), 6.83 (d, J=7.8 Hz, 2H), 7.30-7.52 (m, 10H), 7.83-7.85 (dd, J=8.2, 1.4 Hz, 2H), 7.89-7.93 (m, 2H), 7.97-7.99 (m, 2H), 8.29 (d, J=8.7 Hz, 2H), 8.38 (d, J=8.7 Hz, 2H), 8.70 (d, J=8.7 Hz, 2H). $^{13}$C NMR (100 MHz, CDCl$_3$) δ 27.76, 40.62, 88.78, 119.02, 120.21, 121.44, 122.05, 124.52, 125.35, 125.99, 126.08, 126.90, 127.32, 130.76, 131.25, 133.91, 136.20, 136.45, 136.53, 137.99, 141.48, 149.09, 156.56, 169.50, 194.28. MALDI TOF-MS: m/z [M+H]⁺ Calcd. For $C_{53}H_{44}IrN_2O_2S_2$: 997.24, Found: 997.27. Anal. Calcd. for $C_{53}H_{43}IrN_2O_2S_2$: C, 63.90; H, 4.35; N, 2.81. Found: C, 64.09; H, 4.48; N, 2.81.

(A) Synthesis of Organoiridium Complex Ir-2

(A-i) Synthesis of C—N Ligand (2) (2-(methyldibenzo[b,d]thiophen-4-yl)quinoline)

The C—N ligand (2) is synthesized through the intermediates 1a, 2a, 3a, 4a, and 5a with 2,6-dibromo-4-methylaniline used as the starting material.

Synthesis of Intermediate 1a (3-bromo-5-methyl-[1,1'-biphenyl]-2-amine)

A 2000 mL four-necked round-bottom flask was charged with an aqueous solution of potassium carbonate (33.2 g, 0.240 mol) dissolved in water (120 mL), and the round-bottom flask was further charged with 2,6-dibromo-4-methylaniline (20.1 g, 76.0 mmol), phenylboronic acid (6.35 g, 52.1 mmol), tetrakis(triphenylphosphine)palladium (0) (4.33 g, 3.74 mmol), toluene (200 mL), and ethanol (120 mL), followed by heating and stirring for 13 hours at 100° C. under a nitrogen atmosphere. After being allowed to cool, chloroform (200 mL) was added thereto, and the resultant was shaken in a separating funnel to remove an aqueous layer. An organic layer was washed with water (200 mL) and saturated saline (200 mL), and dried on anhydrous magnesium sulfate, and then, the solvent was distilled off with a rotary evaporator. The thus obtained residue was purified by silica gel column chromatography (development solvent: chloroform/hexane, v/v, 1/3) to obtain a target compound, that is, a white solid of the intermediate 1a (3-bromo-5-methyl-[1,1'-biphenyl]-2-amine), in a yield of 82% (11.2 g, 42.7 mmol).

Synthesis of Intermediate 2a (3-bromo-2-iodo-5-methyl-1,1'-biphenyl)

A 1000 mL four-necked round-bottom flask was charged with the intermediate 1a (3-bromo-5-methyl-[1,1'-biphenyl]-2-amine) (6.02 g, 23.0 mmol), 4 M hydrochloric acid (65 mL), and tetrahydrofuran (65 mL), and the reaction system was kept at 0° C. by immersing the flask in a Dewar flask charged with methanol/acetone used as a refrigerant and liquid nitrogen. An aqueous solution of sodium nitrite (2.01 g, 29.1 mmol) dissolved in water (24 mL) was slowly added thereto in a dropwise manner with a dropping funnel.

After the reaction system was stirred for 20 minutes at 0° C., an aqueous solution of potassium iodide (9.53 g, 57.4 mmol) dissolved in water (36 mL) was added thereto. After the resultant was stirred for 10 minutes at 0° C., the Dewar flask was removed, and the resultant was stirred for further 1 hour with the temperature gradually restored to room temperature. Here, the system had a brown color. A saturated aqueous solution of sodium thiosulfate was added thereto until the color of the system became pale yellow, followed by stirring for 15 minutes. Thereafter, ethyl acetate (200 mL) was added thereto, and the resultant was shaken in a separating funnel to remove an aqueous layer. An organic layer was washed with water (300 mL) and saturated saline (300 mL), and dried on anhydrous sodium sulfate, and then, the solvent was distilled off with a rotary evaporator.

Then, the thus obtained residue was dissolved in chloroform, and 50 g of silica gel was added thereto to cause the residue to be adsorbed onto the silica gel by distilling off the solvent with a rotary evaporator. In a chromatographic column tube (φ: 60 mm), 250 g of silica gel containing a development solvent was put, the silica gel onto which the residue had been adsorbed was further put thereon, and the solvent was rapidly developed (development solvent: hexane) for purification. Through this procedure, a target compound, that is, a white solid of the intermediate 2a (3-bromo-2-iodo-5-methyl-1,1'-biphenyl), was obtained in a yield of 38% (3.28 g, 8.81 mmol).

Synthesis of Intermediate 3a (4-bromo-2-methyldibenzo[b,d]iodol-5-iumtrifluoromethanesulfonate)

A 100 mL three-necked round-bottom flask was charged with the intermediate 2a (3-bromo-2-iodo-5-methyl-1,1'-biphenyl) (3.07 g, 8.25 mmol), trifluoromethanesulfonic acid (3.0 mL, 33.9 mmol), m-chloroperbenzoic acid (containing about 30% of water) (3.03 g, 12.3 mmol), and dehydrated dichloromethane (36 mL), followed by stirring at room temperature for 1 hour under a nitrogen atmosphere. Thereafter, the solvent was distilled off by about 80% with a rotary evaporator. Diethyl ether (45 mL) was added thereto, the resultant was stirred again at room temperature, and the thus obtained precipitate was recovered by suction filtration. Through this procedure, a white solid of the intermediate 3a (4-bromo-2-methyldibenzo[b,d]iodol-5-iumtrifluoromethanesulfonate) that is a cyclic dibenzo iodonium compound was obtained in a yield of 96% (4.13 g, 7.93 mmol).

Synthesis of Intermediate 4a (4-bromo-2-methyldibenzo[b,d]thiophene)

A 100 mL three-necked round-bottom flask was charged with the intermediate 3a (4-bromo-2-methyldibenzo[b,d]iodol-5-iumtrifluoromethanesulfonate) (4.25 g, 8.15 mmol), potassium thioacetate (1.86 g, 16.3 mmol), copper (II) chloride (anhydride) (43.5 mg, 0.324 mmol), and dehydrated dimethylsulfoxide (30 mL) obtained by drying on calcium hydride and distillation, followed by heating and stirring for 20 hours at 110° C. under a nitrogen atmosphere. After being allowed to cool, chloroform (30 mL) and water (30 mL) were added thereto, and the resultant was shaken in a separating funnel to remove an aqueous layer. An organic layer was washed with water (30 mL) and saturated saline (30 mL), and dried on anhydrous sodium sulfate, and then, the solvent was distilled off with a rotary evaporator. The thus obtained residue was dissolved in chloroform, 20 g of silica gel was added thereto, and the residue was caused to be adsorbed onto the silica gel by distilling off the solvent with a rotary evaporator. In a chromatographic column tube ($: 46 mm), 100 g of silica gel containing a development solvent was put, the silica gel onto which the residue had been adsorbed was further put thereon, and the solvent was rapidly developed (development solvent: hexane) for purification. Through this procedure, a pale yellow solid of the intermediate 4a (4-bromo-2-methyldibenzo[b,d]thiophene) that is a bromodibenzothiophene derivative was obtained in a yield of 77% (1.74 g, 6.27 mmol).

Synthesis of Intermediate 5a ((2-methylbenzo[b,d]thiophen-4-yl)boronic acid)

A 100 mL three-necked round-bottom flask in a nitrogen atmosphere was charged with the intermediate 4a (4-bromo-2-methyldibenzo[b,d]thiophene) (4.24 g, 15.3 mmol) and dehydrated tetrahydrofuran (45.0 mL), and the reaction system was cooled to −78° C. by immersing the resultant flask in a Dewar flask charged with liquid nitrogen and methanol/acetone used as a refrigerant. To the resultant, 1.6 M n-butyllithium (12.0 mL, 19.2 mmol) was slowly added in a dropwise manner with a dropping funnel, followed by stirring at −78° C. for 1.5 hours. Thereafter, triisopropyl borate (11.0 mL, 71.3 mmol) was added thereto in a dropwise manner with a dropping funnel, followed by stirring for 18 hours with the temperature slowly restored to room temperature. Thereafter, 75 mL of 4 M hydrochloric acid was added thereto, followed by stirring at room temperature for 1 hour. After the reaction, dichloromethane (50 mL) was added thereto, the resultant was shaken in a separating funnel to remove an aqueous layer, and dried on anhydrous sodium sulfate, and then, the solvent was distilled off with a rotary evaporator. The thus obtained residue was dissolved in 10 mL of dichloromethane, 50 mL of hexane was added thereto, and thus, a white solid was precipitated by re-precipitation. This precipitate was recovered by suction filtration. On TLC, merely a spot corresponding to $R_f$=0 (development solvent: chloroform) was found. The resultant was used in a next reaction without further purification. Through this procedure, the intermediate 5a ((2-methylbenzo[b,d]thiophen-4-yl)boronic acid) was synthesized in a yield of 67% (2.49 g, 10.3 mmol).

Synthesis of C—N Ligand (2)

A 2 L three-necked round-bottom flask was charged with an aqueous solution of potassium carbonate (13.5 g, 97.7 mmol) dissolved in water (280 mL), and the round-bottom flask was further charged with the intermediate 5a ((2-methylbenzo[b,d]thiophen-4-yl)boronic acid) (6.76 g, 27.9 mmol), 2-chloroquinoline (4.88 g, 29.8 mmol), tetrakis(triphenylphosphine)palladium (0) (1.70 g, 1.47 mmol), 1,2-dimethoxyethane (280 mL), and ethanol (120 mL), followed by heating and stirring for 18 hours at 100° C. under a nitrogen atmosphere. After being allowed to cool, chloroform (200 mL) was added thereto, and the resultant was shaken in a separating funnel to remove an aqueous layer. An organic layer was washed with water (200 mL) and saturated saline (200 mL), and dried on anhydride magnesium sulfate, and then, the solvent was distilled off with a rotary evaporator. The thus obtained residue was purified by silica gel column chromatography (development solvent: chloroform/hexane, v/v, 2/3) to obtain a pale yellow solid of 2-(methyldibenzo[b,d]thiophen-4-yl)quinoline, that is, the C—N ligand (2), in a yield of 97% (8.83 g, 27.1 mmol).

(A-ii) Synthesis of Precursor (2)

A 100 mL two-necked round-bottom flask was charged with the C—N ligand (2) (0.732 g, 2.25 mmol) synthesized as described above, trichloroiridium hydrate (0.397 g, 1.12 mmol), 2-ethoxyethanol (40 mL), and water (8 mL), followed by heating and stirring for 20 hours at 100° C. under a nitrogen atmosphere. After being allowed to cool, an orange precipitate thus generated in the reaction system was recovered by suction filtration. Through this procedure, the precursor (2) of the C—N ligand (2) and iridium was synthesized (yield 56% (0.554 g, 0.316 mmol).

(A-iii) Synthesis of Organoiridium Complex (Ir-2)

A 50 mL two-necked round-bottom flask was charged with the precursor (2) (152 mg, 0.0867 mmol) synthesized as described above, dipivaloyl methane (0.1 mL, 0.488 mmol), sodium carbonate (96.2 mg, 0.911 mmol), and 2-ethoxyethanol (20 mL), followed by heating and stirring for 3 hours at 85° C. under a nitrogen atmosphere. After being allowed to cool, dichloromethane (20 mL) and water (30 mL) were added thereto, and the resultant was shaken in a separating funnel to remove an aqueous layer. An organic layer was washed with saturated saline (30 mL), and dried on anhydride sodium sulfate, and then, the solvent was distilled off with a rotary evaporator. The thus obtained residue was purified by silica gel column chromatography (development solvent: dichloromethane/hexane, v/v, 1/1), and the resultant was washed by adding hexane thereto and stirring the resultant at 75° C., and recovered by suction filtration to obtain a target compound, that is, the organoiridium complex (Ir-2). The organoiridium complex was a red solid, and the yield was 5.2% (9.1 mg, 0.00864 mmol). Besides, properties obtained by NMR and the like of the compound synthesized through the aforementioned procedures were as follows.

$^1$H NMR (400 MHz, CDCl$_3$) δ 0.55 (s, 18H), 1.51 (s, 6H), 4.59 (s, 1H), 7.20-7.24 (m, 2H), 7.36-7.41 (m, 2H), 7.42-7.46 (m, 4H), 7.56 (s, 2H), 7.68 (d, J=9.2 Hz, 2H), 7.74 (d, J=6.8 Hz, 2H), 7.93-7.96 (m, 4H), 8.08-8.10 (m, 4H), 8.29 (d, J=9.2 Hz, 2H), 8.73 (d, J=9.2 Hz, 2H). $^{13}$C NMR (100 MHz, CDCl$_3$) δ 23.77, 28.14, 29.79, 88.39, 119.79, 120.45, 120.94, 122.21, 124.57, 125.42, 125.45, 125.70, 126.34, 127.34, 130.49, 132.10, 133.33, 136.15, 137.04, 143.89, 149.50, 154.43, 170.36, 193.55. ESI-MS: m/z [M+H]$^+$ Calcd. For $C_{55}H_{48}IrN_2O_2S_2$: 1025.28, Found: 1025.27. Anal. Calcd. for $C_{55}H_{47}IrN_2O_2S_2$: C, 64.49; H, 4.63; N, 2.73. Found: C, 64.24; H, 4.67; N, 2.70.

(B) Synthesis of Organoiridium Complex Ir-3

(B-i) Synthesis of C—N Ligand (3) (2-(6,8-dimethylbenzo[b,d]thiophen-4-yl)quinoline)

The C—N ligand (3) is synthesized through the intermediates 1b, 2b, 3b, 4b, and 5b with 2,6-dibromoaniline used as the starting material.

Synthesis of Intermediate 1b (3-bromo-3',5'-dimethyl-[1,1'-biphenyl]-2-amine)

A 1000 mL four-necked round-bottom flask was charged with an aqueous solution of potassium carbonate (13.0 g, 93.7 mmol) dissolved in water (60 mL), and the round-bottom flask was further charged with 2,6-dibromoaniline (10.1 g, 40.1 mmol), 3,5-dimethylphenylboronic acid (4.05 g, 27.0 mmol), tetrakis(triphenylphosphine)palladium (0) (1.61 g, 1.39 mmol), toluene (200 mL), and ethanol (60 mL), followed by heating and stirring for 20 hours at 100° C. under a nitrogen atmosphere. After being allowed to cool, chloroform (150 mL) was added thereto, and the resultant was shaken in a separating funnel to remove an aqueous layer. An organic layer was washed with water (200 mL) and saturated saline (200 mL), and dried on anhydrous magnesium sulfate, and then, the solvent was distilled off with a rotary evaporator. The thus obtained residue was purified by silica gel column chromatography (development solvent: chloroform/hexane, v/v, 2/3) to obtain a target compound, that is, a white solid of the intermediate 1b (3-bromo-3',5'-dimethyl-[1,1'-biphenyl]-2-amine), in a yield of 42% (3.13 g, 11.3 mmol).

Synthesis of Intermediate 2b (3-bromo-2-iodo-3',5'-methyl-1,1'-biphenyl)

A 500 mL three-necked round-bottom flask was charged with the intermediate 1b (3-bromo-3',5'-dimethyl-[1,1'-biphenyl]-2-amine) (3.08 g, 11.2 mmol), 4 M hydrochloric acid (32 mL), and tetrahydrofuran (32 mL), and the reaction system was cooled to 0° C. by immersing the resultant flask in a Dewar flask charged with liquid nitrogen and methanol/acetone used as a refrigerant. An aqueous solution of sodium nitrite (1.05 g, 15.2 mmol) dissolved in water (12 mL) was slowly added thereto in a dropwise manner with a dropping funnel.

After the reaction system was stirred for 20 minutes at 0° C., an aqueous solution of potassium iodide (4.74 g, 28.6 mmol) dissolved in water (18 mL) was added thereto. After the resultant was stirred for 10 minutes at 0° C., the Dewar flask was removed, and the resultant was stirred for further 1 hour with the temperature slowly restored to room temperature. Here, the system had a brown color. A saturated aqueous solution of sodium thiosulfate was added thereto until the color of the system became pale yellow, followed by stirring for 15 minutes. Thereafter, ethyl acetate (100 mL) was added thereto, and the resultant was shaken in a separating funnel to remove an aqueous layer. An organic layer was washed with water (100 mL) and saturated saline (100 mL), and dried on anhydrous sodium sulfate, and then, the solvent was distilled off with a rotary evaporator.

Then, the thus obtained residue was dissolved in chloroform, and 25 g of silica gel was added thereto to cause the residue to be adsorbed onto the silica gel by distilling off the solvent with a rotary evaporator. In a chromatographic column tube (φ: 46 mm), 125 g of silica gel containing a development solvent was put, the silica gel onto which the residue had been adsorbed was further put thereon, and the solvent was rapidly developed (development solvent: hexane) for purification. Thus, a target compound, that is, the intermediate 2b (3-bromo-2-iodo-3',5'-methyl-1,1'-biphenyl), was obtained in a yield of 49% (2.11 g, 5.46 mmol. This compound was a transparent liquid having a high viscosity.

Synthesis of Intermediate 3b (6-bromo-2,4-dimethyldibenzo[b,d]iodol-5-iumtrifluoromethanesulfonate)

A 100 mL three-necked round-bottom flask was charged with the intermediate 2b (3-bromo-2-iodo-3',5'-methyl-1,1'-biphenyl) (2.08 g, 5.37 mmol), trifluoromethanesulfonic acid (1.4 mL, 15.9 mmol), m-chloroperbenzoic acid (containing about 30% of water) (1.78 g, 7.22 mmol), and dehydrated dichloromethane (20 mL), followed by stirring at room temperature for 1 hour under a nitrogen atmosphere. Thereafter, the solvent was distilled off by about 80% with a rotary evaporator. Diethyl ether (20 mL) was added thereto, the resultant was stirred at room temperature for 30 minutes, and the thus generated precipitate was recovered by suction filtration. Through this procedure, a white solid of the intermediate 3b (6-bromo-2,4-dimethyldibenzo[b,d]iodol-5-iumtrifluoromethanesulfonate) that is a cyclic dibenzo iodonium compound was obtained in a yield of 90% (2.57 g, 4.83 mmol).

Synthesis of Intermediate 4b (6-bromo-2,4-methyldibenzo[b,d]thiophene)

A 50 mL two-necked round-bottom flask was charged with the intermediate 3b (6-bromo-2,4-dimethyldibenzo[b,d]iodol-5-iumtrifluoromethanesulfonate) (2.50 g, 4.69 mmol), potassium thioacetate (1.08 g, 9.46 mmol), copper (II) chloride (anhydride) (25.3 mg, 0.188 mmol), and dehydrated dimethylsulfoxide (15 mL) obtained by drying on calcium hydride and distillation, followed by heating and stirring for 20 hours at 110° C. under a nitrogen atmosphere. After being allowed to cool, chloroform (20 mL) and water (20 mL) were added thereto, and the resultant was shaken in a separating funnel to remove an aqueous layer. An organic layer was washed with water (20 mL) and saturated saline (30 mL), and dried on anhydride sodium sulfate, and then, the solvent was distilled off with a rotary evaporator. The thus obtained residue was dissolved in chloroform, 20 g of silica gel was added thereto, and the residue was caused to be adsorbed onto the silica gel by distilling off the solvent with a rotary evaporator. In a chromatographic column tube (φ: 32 mm), 100 g of silica gel containing a development solvent was put, the silica gel onto which the residue had been adsorbed was further put thereon, and the solvent was rapidly developed (development solvent: hexane) for purification. The thus obtained white solid was recrystallized in ethanol. Through this procedure, a white solid of the intermediate 4b (6-bromo-2,4-methyldibenzo[b,d]thiophene) that is a bromodibenzothiophene derivative was obtained in a yield of 43% (0.585 g, 2.01 mmol).

Synthesis of Intermediate 5b ((6,8-dimethylbenzo[b,d]thiophen-4-yl)boronic acid)

A 100 mL three-necked round-bottom flask in a nitrogen atmosphere was charged with the intermediate 4b (6-bromo-2,4-methyldibenzo[b,d]thiophene) (0.579 g, 1.99 mmol) and dehydrated tetrahydrofuran (8 mL), and the reaction system was cooled to −78° C. by immersing the resultant flask in a Dewar flask charged with liquid nitrogen and methanol/acetone used as a refrigerant. To the resultant, 1.6 M n-butyllithium (1.6 mL, 2.56 mmol) was slowly added in a dropwise manner with a dropping funnel, followed by stirring at −78° C. for 1.5 hours. Thereafter, triisopropyl borate (3.2 mL, 14.0 mmol) was added thereto in a dropwise manner with a dropping funnel, followed by stirring for 18 hours with the temperature slowly restored to room temperature. Thereafter, 8 mL of 4 M hydrochloric acid was added thereto, followed by stirring at room temperature for further 1 hour. After the reaction, dichloromethane (30 mL) was added thereto, the resultant was shaken in a separating funnel to remove an aqueous layer, and dried on anhydrous sodium sulfate, and then, the solvent was distilled off with a rotary evaporator. The thus obtained residue was dissolved in 5 mL of dichloromethane, 30 mL of hexane was added thereto, and thus, a white solid was precipitated by re-precipitation. This precipitate was recovered by suction filtration. On TLC, merely a spot corresponding to $R_f$=0 (development solvent: chloroform) was found. The resultant was used in a next reaction without further purification. Through this procedure, the intermediate 5b ((6,8-dimethylbenzo[b,d]thiophen-4-yl)boronic acid) was synthesized in a yield of 60% (0.306 g, 1.19 mmol).

Synthesis of C—N Ligand (3)

A 100 mL two-necked round-bottom flask was charged with an aqueous solution of potassium carbonate (0.516 g, 3.69 mmol) dissolved in water (12 mL), and the round-bottom flask was further charged with the intermediate 5b (6,8-dimethylbenzo[b,d]thiophen-4-yl)boronic acid) (0.298 g, 1.16 mmol), 2-chloroquinoline (0.192 g, 1.17 mmol), tetrakis(triphenylphosphine)palladium (0) (62.3 mg, 0.0537 mmol), 1,2-dimethoxyethane (12 mL), and ethanol (5 mL), followed by heating and stirring for 18 hours at 100° C. under a nitrogen atmosphere. After being allowed to cool, chloroform (20 mL) was added thereto, and the resultant was shaken in a separating funnel to remove an aqueous layer. An organic layer was washed with water (20 mL) and saturated saline (20 mL), and dried on anhydride magnesium sulfate, and then, the solvent was distilled off with a rotary evaporator. The thus obtained residue was purified by silica gel column chromatography (development solvent: chloroform/hexane, v/v, 2/3) to obtain a white solid of 2-(6,8- dimethylbenzo[b,d]thiophen-4-yl)quinoline, that is, the C—N ligand (3), in a yield of 73%.

(B-ii) Synthesis of Precursor (3)

A 50 mL two-necked round-bottom flask was charged with the C—N ligand (3) (0.270 g, 0.795 mmol) synthesized as described above, trichloroiridium hydrate (0.140 g, 0.396 mmol), 2-ethoxyethanol (15 mL), and water (3 mL), followed by heating and stirring for 20 hours at 100° C. under a nitrogen atmosphere. After being allowed to cool, a deep red precipitate thus generated in the reaction system was recovered by suction filtration. Through this procedure, the precursor (3) of the C—N ligand (3) and iridium was synthesized (yield 48% (172 mg, 0.0954 mmol)).

(B-iii) Synthesis of Organoiridium Complex (Ir-3)

A 50 mL two-necked round-bottom flask was charged with the precursor (3) (156 mg, 0.0862 mmol) synthesized as described above, dipivaloyl methane (0.1 mL, 0.488 mmol), sodium carbonate (96.2 mg, 0.911 mmol), and 2-ethoxyethanol (20 mL), followed by heating and stirring for 15 minutes at 100° C. under a nitrogen atmosphere. After being allowed to cool, dichloromethane (30 mL) and water (30 mL) were added thereto, and the resultant was shaken in a separating funnel to remove an aqueous layer. An organic layer was washed with saturated saline (30 mL), and dried on anhydride sodium sulfate, and then, the solvent was distilled off with a rotary evaporator. The thus obtained residue was purified by silica gel column chromatography (development solvent: dichloromethane/hexane, v/v, 1/1). Thereafter, the resultant was washed with a solvent by adding cyclohexane thereto and stirring the resultant at 85° C., and after being allowed to cool, the thus precipitated solid was recovered by suction filtration to obtain a target compound, that is, the organoiridium complex (Ir-3). The organoiridium complex was a red solid, and the yield was 40% (72.5 mg, 0.0690 mmol). Besides, properties obtained by NMR and the like of the compound synthesized through the aforementioned procedures were as follows.

$^1$H NMR (400 MHz, $CD_2Cl_2$) δ 0.52 (s, 18H), 2.36 (s, 6H), 2.58 (s, 6H), 4.82 (s, 1H), 6.71 (d, J=8.2 Hz, 2H), 7.01 (s, 2H), 7.27-7.33 (m, 4H), 7.43 (t, J=7.1 Hz, 2H), 7.57 (s, 2H), 7.82 (d, J=7.8 Hz2H), 8.25 (d, J=7.8 Hz2H), 8.38 (d, J=7.8 Hz2H), 8.72 (d, J=7.8 Hz, 2H). $^{13}$C NMR (100 MHz, $CDCl_3$) δ 20.43, 21.62, 27.78, 40.62, 88.69, 118.01, 119.14, 121.64, 125.89, 126.07, 127.00, 127.29, 127.40, 130.66, 131.14, 131.83, 133.56, 133.90, 134.58, 136.24, 136.72, 137.89, 141.46, 149.11, 156.33, 169.61, 194.23. MALDI TOF-MS: m/z [M]$^+$ Calcd. For $C_{57}H_{51}IrN_2O_2S_2$: 1052.30, Found: 1052.32. Anal. Calcd. For $C_{57}H_{51}IrN_2O_2S_2$: C, 65.05; H, 4.88; N, 2.66. Found: C, 64.93; H, 4.83; N, 2.52.

(C) Synthesis of Organoiridium Complex Ir-4

(C-i) Synthesis of C—N Ligand (4) (2-(6,6,8-trimethylbenzo[b,d]thiophen-4-yl)quinoline)

The C—N ligand (4) is synthesized through the intermediates 1c, 2c, 3c, 4c, and 5c with 2,6-dibromo-4-methylaniline used as the starting material.

Synthesis of Intermediate 1c (3-bromo-3',5,5'-trimethyl-[1,1'-biphenyl]-2-amine)

A 1000 mL four-necked round-bottom flask was charged with an aqueous solution of potassium carbonate (3.96 g, 28.86 mmol) dissolved in water (90 mL), and the round-bottom flask was further charged with 2,6-dibromo-4-methylaniline (15.06 g, 56.9 mmol), 3,5-dimethylphenylboronic acid (5.66 g, 37.8 mmol), tetrakis(triphenylphosphine)palladium (0) (2.14 g, 1.85 mmol), toluene (450 mL), and ethanol (90 mL), followed by heating and stirring for 20 hours at 100° C. under a nitrogen atmosphere. After being allowed to cool, chloroform (200 mL) was added thereto, and the resultant was shaken in a separating funnel to remove an aqueous layer. An organic layer was washed with water (200 mL) and saturated saline (200 mL), and dried on anhydrous magnesium sulfate, and then, the solvent was distilled off with a rotary evaporator. The thus obtained residue was purified by silica gel column chromatography (development solvent: chloroform/hexane, v/v, 2/3). The thus obtained pale yellow solid was recrystallized in ethanol to obtain a target compound, that is, a white solid of the intermediate 1c (3-bromo-3',5,5'-trimethyl-[1,1'-biphenyl]-2-amine), in a yield of 38% (4.16 g, 14.4 mmol).

Synthesis of Intermediate 2c (3-bromo-2-iodo-3',5,5'-trimethyl-[1,1'-biphenyl])

A 500 mL three-necked round-bottom flask was charged with the intermediate 1c (3-bromo-3',5,5'-trimethyl-[1,1'-biphenyl]-2-amine) (4.10 g, 14.1 mmol), 4 M hydrochloric acid (40 mL), and tetrahydrofuran (40 mL), and the reaction system was cooled to 0° C. by immersing the flask in a Dewar flask charged with methanol/acetone used as a refrigerant and liquid nitrogen. An aqueous solution of sodium nitrite (1.21 g, 17.5 mmol) dissolved in water (15 mL) was slowly added thereto in a dropwise manner with a dropping funnel.

After the reaction system was stirred for 20 minutes at 0° C., an aqueous solution of potassium iodide (5.95 g, 35.9 mmol) dissolved in water (25 mL) was added thereto. After the resultant was stirred for 10 minutes at 0° C., the Dewar flask was removed, and the resultant was stirred for further 1 hour with the temperature gradually restored to room temperature. Here, the system had a brown color. A saturated aqueous solution of sodium thiosulfate was added thereto until the color of the system became pale yellow, followed by stirring for 15 minutes. Thereafter, ethyl acetate (150 mL) was added thereto, and the resultant was shaken in a separating funnel to remove an aqueous layer. An organic layer was washed with water (200 mL) and saturated saline (200 mL), and dried on anhydrous sodium sulfate, and then, the solvent was distilled off with a rotary evaporator.

Then, the thus obtained residue was dissolved in chloroform, and 50 g of silica gel was added thereto to cause the residue to be adsorbed onto the silica gel by distilling off the solvent with a rotary evaporator. Thereafter, in a chromatographic column tube (φ: 60 mm), 250 g of silica gel containing a development solvent was put, and the silica gel onto which the residue had been adsorbed was further put thereon. The solvent was rapidly developed for purification. Hexane was used as the development solvent. Thus, a target compound, that is, the intermediate 2c (3-bromo-2-iodo-3', 5,5'-trimethyl-1,1'-biphenyl), was obtained in a yield of 49% (2.77 g, 6.90 mmol). This compound was a transparent liquid having a high viscosity.

Synthesis of Intermediate 3c (4-bromo-2,6,8-trimethyldibenzo[b,d]iodol-5-iumtrifluoromethanesulfonate)

A 100 mL three-necked round-bottom flask was charged with the intermediate 2c (3-bromo-2-iodo-3',5,5'-trimethyl-1,1'-biphenyl) (2.65 g, 6.61 mmol), trifluoromethanesulfonic acid (1.7 mL, 19.3 mmol), m-chloroperbenzoic acid (containing about 30% of water) (2.14 g, 8.66 mmol), and dehydrated dichloromethane (25 mL), followed by stirring at room temperature for 1 hour under a nitrogen atmosphere.

Thereafter, the solvent was distilled off by about 80% with a rotary evaporator. Diethyl ether (25 mL) was added thereto, the resultant was stirred at room temperature for 30 minutes, and the thus generated precipitate was recovered by suction filtration. Through this procedure, a white solid of the intermediate 3c (4-bromo-2,6,8-trimethyldibenzo[b,d]iodol-5-iumtrifluoromethanesulfonate) that is a cyclic dibenzo iodonium compound was obtained in a yield of 93% (3.38 g, 6.15 mmol).

Synthesis of Intermediate 4c (4-bromo-2,6,8-trimethyldibenzo[b,d]thiophene)

A 50 mL two-necked round-bottom flask was charged with the intermediate 3c (4-bromo-2,6,8-trimethyldibenzo[b,d]iodol-5-iumtrifluoromethanesulfonate) (3.35 g, 6.10 mmol), potassium thioacetate (1.40 g, 12.2 mmol), copper (II) chloride (anhydride) (32.4 mg, 0.241 mmol), and dehydrated dimethylsulfoxide (25 mL) obtained by drying on calcium hydride and distillation, followed by heating and stirring for 20 hours at 110° C. under a nitrogen atmosphere. After being allowed to cool, chloroform (30 mL) and water (30 mL) were added thereto, and the resultant was shaken in a separating funnel to remove an aqueous layer. An organic layer was washed with water (40 mL) and saturated saline (30 mL), and dried on anhydride sodium sulfate, and then, the solvent was distilled off with a rotary evaporator. The thus obtained residue was dissolved in chloroform, 20 g of silica gel was added thereto, and the residue was caused to be adsorbed onto the silica gel by distilling off the solvent with a rotary evaporator. In a chromatographic column tube ($\phi$: 32 mm), 100 g of silica gel containing a development solvent was put, the silica gel onto which the residue had been adsorbed was further put thereon, and the solvent was rapidly developed (development solvent: hexane) for purification. The thus obtained white solid was recrystallized in ethanol. Through this procedure, a white solid of the intermediate 4c (4-bromo-2,6,8-trimethyldibenzo[b,d]thiophene) that is a bromodibenzothiophene derivative was obtained in a yield of 47% (0.876 g, 2.87 mmol).

Synthesis of Intermediate 5c ((2,6,8-trimethyldibenzo[b,d]thiophen-4-yl)boronic acid)

A 100 mL three-necked round-bottom flask in a nitrogen atmosphere was charged with the intermediate 4c (4-bromo-2,6,8-trimethyldibenzo[b,d]thiophene) (0.865 g, 2.83 mmol) and dehydrated tetrahydrofuran (12 mL), and the reaction system was cooled to −78° C. by immersing the resultant flask in a Dewar flask charged with liquid nitrogen and methanol/acetone used as a refrigerant. To the resultant, 1.6 M n-butyllithium (2.5 mL, 3.88 mmol) was slowly added in a dropwise manner with a dropping funnel, followed by stirring at −78° C. for 1.5 hours. Thereafter, triisopropyl borate (4.8 mL, 20.9 mmol) was added thereto in a dropwise manner with a dropping funnel, and the resultant was stirred for 18 hours with the temperature gradually restored to room temperature. Thereafter, 12 mL of 4 M hydrochloric acid was added thereto, followed by stirring at room temperature for 1 hour. After the reaction, dichloromethane (30 mL) was added thereto, the resultant was shaken in a separating funnel to remove an aqueous layer, and was dried on anhydrous sodium sulfate, and then, the solvent was distilled off with a rotary evaporator. The thus obtained residue was dissolved in 10 mL of dichloromethane, 50 mL of hexane was added thereto, and the thus precipitated white solid was recovered by suction filtration. Thus, the intermediate 5c ((2,6,8-trimethyldibenzo[b,d]thiophen-4-yl)boronic acid) was synthesized in a yield of 62% (0.474 g, 1.75 mmol).

Synthesis of C—N Ligand (4)

A 100 mL three-necked round-bottom flask was charged with an aqueous solution of potassium carbonate (0.782 g, 5.66 mmol) dissolved in water (20 mL), and the round-bottom flask was further charged with the intermediate 5c ((2,6,8-trimethyldibenzo[b,d]thiophen-4-yl)boronic acid) (0.470 g, 1.74 mmol), 2-chloroquinoline (0.290 g, 1.77 mmol), tetrakis(triphenylphosphine)palladium (0) (92.1 mg, 0.0797 mmol), 1,2-dimethoxyethane (20 mL), and ethanol (8 mL), followed by heating and stirring for 18 hours at 100° C. under a nitrogen atmosphere. After being allowed to cool, chloroform (50 mL) was added thereto, and the resultant was shaken in a separating funnel to remove an aqueous layer. An organic layer was washed with water (50 mL) and saturated saline (50 mL), and dried on anhydride magnesium sulfate, and then, the solvent was distilled off with a rotary evaporator. The thus obtained residue was purified by silica gel column chromatography (development solvent: chloroform/hexane, v/v, 4/1) to obtain a white solid of 2-(2,6,8-trimethylbenzo[b,d]thiophen-4-yl)quinoline, that is, the C—N ligand (4), in a yield of 73% (0.466 g, 1.27 mmol).

(C-ii) Synthesis of Precursor (4)

A 100 mL two-necked round-bottom flask was charged with the C—N ligand (4) (0.410 g, 1.15 mmol) synthesized as described above, trichloroiridium hydrate (0.204 g, 0.581 mmol), 2-ethoxyethanol (30 mL), and water (6 mL), followed by heating and stirring for 20 hours at 100° C. under a nitrogen atmosphere. After being allowed to cool, a red precipitate thus generated in the reaction system was recovered by suction filtration. Through this procedure, the precursor (4) of the C—N ligand (4) and iridium was synthesized (yield 47% (0.252 g, 0.135 mmol)).

(C-iii) Synthesis of Organoiridium Complex (Ir-4)

A 50 mL two-necked round-bottom flask was charged with the precursor (4) (212 mg, 0.114 mmol) synthesized as described above, dipivaloyl methane (0.1 mL, 0.488 mmol), sodium carbonate (110 mg, 1.04 mmol), and 2-ethoxyethanol (30 mL), followed by heating and stirring at 85° C. for 3 hours under a nitrogen atmosphere. After being allowed to cool, dichloromethane (30 mL) and water (30 mL) were added thereto, and the resultant was shaken in a separating funnel to remove an aqueous layer. An organic layer was washed with saturated saline (30 mL), and dried on anhydride sodium sulfate, and then, the solvent was distilled off with a rotary evaporator. The thus obtained residue was purified by silica gel column chromatography (development solvent: dichloromethane/hexane, v/v, 1/1), the resultant was washed with a solvent by adding cyclohexane thereto and stirring the resultant at 75° C., and a target compound, that is, the organoiridium complex (Ir-4), was obtained by suction filtration. The organoiridium complex was a red solid, and the yield was 3.8% (9.4 mg, 0.0866 mmol). Besides, properties obtained by NMR and the like of the compound synthesized through the aforementioned procedures were as follows.

$^1$H NMR (400 MHz, CDCl$_3$) δ 0.54 (s, 18H), 1.49 (s, 3H), 2.49 (s, 3H), 2.68 (s, 3H), 4.58 (s, 1H), 7.08 (s, 2H), 7.16-7.21 (m, 2H), 7.35-7.37 (m, 2H), 7.51 (s, 2H), 7.66 (d, J=8.7 Hz, 2H), 7.72-7.74 (m, 4H), 8.28 (d, J=8.7 Hz, 2H), 8.79 (d, J=9.2 Hz, 2H). $^{13}$C NMR (100 MHz, CDCl$_3$) δ 20.54, 21.59, 23.75, 28.15, 40.61, 88.36, 118.20, 119.90, 121.17, 124.85, 125.58, 126.39, 127.30, 127.48, 130.39, 131.38, 132.69, 134.14, 134.60, 136.04, 136.84, 142.31, 143.80, 148.81, 159.68, 168.49, 187.84, 193.55. ESI-MS: m/z [M+H]$^+$ Calcd. For C$_{59}$H$_{56}$IrN$_2$O$_2$S$_2$: 1081.34, Found:

1081.37. Anal. Calcd. For $C_{59}H_{55}IrN_2O_2S_2$: C, 65.59; H, 5.13; N, 2.59. Found: C, 65.37; H, 4.77; N, 2.59.

(II) Property Evaluation of each Organoiridium Complex

The organoiridium complexes (Ir-1 to Ir-4) synthesized as described above were measured and evaluated for optical properties (emission spectrum, and PL quantum yields). Besides, each of the iridium complexes was used to produce an OLED to evaluate an EL property.

[Measurement/Evaluation of Light Emission Property of Organoiridium Complex]

Each of the organoiridium complexes was measured for the emission (PL) spectrum and the PL quantum yield $\Phi_{PL}$. For the measurement of the PL spectrum, Fluorolog-3 spectrometer manufactured by HORIBA, Ltd. was used. For the measurement of the PL quantum yield, C9920-12 Quantum yield measuring machine manufactured by HAMAMATSU Photonics K.K. was used.

The evaluation of the light emission property was conducted by performing evaluation of the property in organic solvents (dichloromethane ($CH_2Cl_2$), toluene) and of the property in a polymer thin film (polymethyl methacrylate (PMMA)) used as media. The organic solvents were dichloromethane and toluene both for spectroscopic analysis, and the measurement was conducted with a sample put in a cell having an optical path length of 1 cm.

Besides, the PMMA thin film was formed by dissolving 1 g of PMMA and 0.04 mmol of the organoiridium complex in dehydrated toluene under an argon atmosphere, and dropping the thus obtained solution through a syringe filter to be spin coated (for 2 seconds at 2000 rpm, for 60 seconds at 4000 rpm). The resultant was baked at 115° C. for 1 hour to be formed into the PMMA thin film to be used for the measurement.

<Light Emission Property in Organic Solvents>

Figure 2:
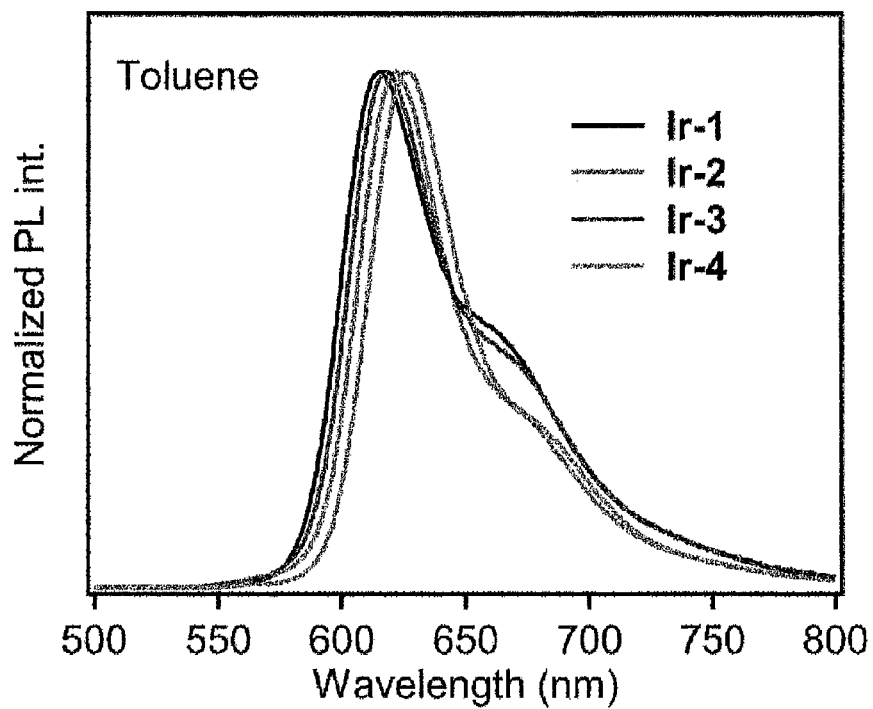
FIG. 2 is a diagram of emission spectrum in a toluene solution of the organoiridium complexes Ir-1 to Ir-4 synthesized in the present embodiment.

The emission spectrum in the organic solvents (the dichloromethane solution and the toluene solution) of the organoiridium complexes Ir-1 to Ir-4 synthesized in the present embodiment are illustrated in FIGS. 1 and 2. Besides, measurement results of the light emission properties in the organic solvents are all shown in Tables 1 and 2.

TABLE 1

| Compd | $\lambda_{PL}$ (nm) | FWHM (nm) | $\Phi_{PL}$ |
|---|---|---|---|
| Ir-1 | 619 | 82 | 0.70 |
| Ir-2 | 623 | 71 | 0.85 |
| Ir-3 | 622 | 82 | 0.73 |
| Ir-4 | 629 | 60 | 0.80 |

TABLE 2

| Compd | $\lambda_{PL}$ (nm) | FWHM (nm) | $\Phi_{PL}$ |
|---|---|---|---|
| Ir-1 | 616 | 65 | 0.80 |
| Ir-2 | 622 | 45 | 0.88 |
| Ir-3 | 618 | 53 | 0.81 |
| Ir-4 | 627 | 45 | 0.85 |

The light emission wavelengths ($\lambda_{PL}$) of the organoiridium complexes Ir-1 to Ir-4 synthesized in the present embodiment were 619 nm to 629 nm in the dichloromethane solution (Table 1), and 616 nm to 627 nm in the toluene solution (Table 2), and thus red orange or red light was emitted. In either of the organic solvents, the emission wavelengths of the organoiridium complexes (Ir-2 to Ir-4) having a methyl group introduced thereinto according to the present embodiment exhibited a shift to a long wavelength side (red shift) as compared with that of the unsubstituted organoiridium complex (Ir-1). Besides, referring to full width half maximum (FWHM) of the light emission, there was a tendency that that of Ir-2 to Ir-4 was narrower than that of Ir-1. Accordingly, it was confirmed that the organoiridium complexes (Ir-2 to Ir-4) having a methyl group introduced thereinto according to the present embodiment exhibit red phosphorescence improved in color purity owing to the introduction of the methyl group.

Referring to the measurement results of the PL quantum efficiency ($\Phi_{PL}$), all the organoiridium complexes exhibited a high value exceeding 0.7. It was confirmed that the organoiridium complexes (Ir-2 to Ir-4) having a methyl group introduced thereinto according to the present embodiment were improved in the $\Phi_{PL}$ in either of the organic solvents as compared with the unsubstituted organoiridium complex (Ir-1).

<Light Emission Property in PMMA Thin Film>

Figure 3:
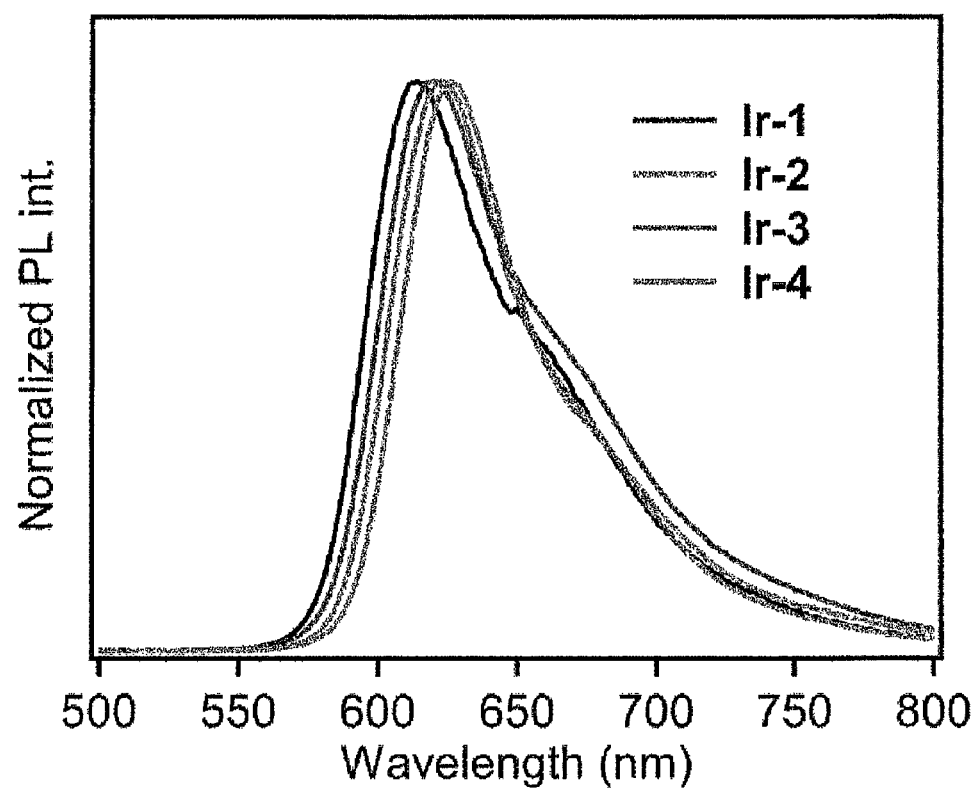
FIG. 3 is a diagram of emission spectrum in a PMMA thin film of the organoiridium complexes Ir-1 to Ir-4 synthesized in the present embodiment.

The emission spectrum of PMMA thin films containing the organoiridium complexes Ir-1 to Ir-4 synthesized in the present embodiment are illustrated in FIG. 3. Besides, measurement results of the light emission properties in the PMMA thin films are all shown in Table 3.

TABLE 3

| Compd | $\lambda_{PL}$ (nm) | FWHM (nm) | $\Phi_{PL}$ |
|---|---|---|---|
| Ir-1 | 614 | 71 | 0.82 |
| Ir-2 | 623 | 60 | 0.85 |
| Ir-3 | 620 | 73 | 0.77 |
| Ir-4 | 626 | 55 | 0.87 |

The light emission properties in the PMMA thin films of the organoiridium complexes Ir-1 to Ir-4 synthesized in the present embodiment show a similar tendency to the light emission properties in the above organic solvents. These $\lambda_{PL}$ were 616 nm to 627 nm exhibiting red orange or red light emission. The organoiridium complexes (Ir-2 to Ir-4) having a methyl group introduced thereinto according to the present embodiment exhibited light emission having red shift as compared with the unsubstituted organoiridium complex (Ir-1) of the conventional example. Referring to the (PL, all the organoiridium complexes exhibited a value exceeding 0.75. In particular, Ir-2 and Ir-4 were improved in the $\Phi_{PL}$ as compared with Ir-1, and exhibited a high value exceeding 0.85.

Besides, referring to the results of Ir-3, the FWHM was wider than that of Ir-1, and the $\Phi_{PL}$ was lower than that of Ir-1. This suggests that the introduction of a methyl group into the 2'-position should be prioritized as the introduction position of the methyl group. Although Ir-3 is rather inferior in the light emission property, it is a significant complex because it exhibited red shift from the unsubstituted complex.

[Evaluation of Electroluminescent Property of Organoiridium Complex]

In order to study electroluminescent properties of the organoiridium complexes (Ir-1 to Ir-4) synthesized in the present embodiment, organic electroluminescent elements (OLEDs) were produced to evaluate their performances.

Figure 4:
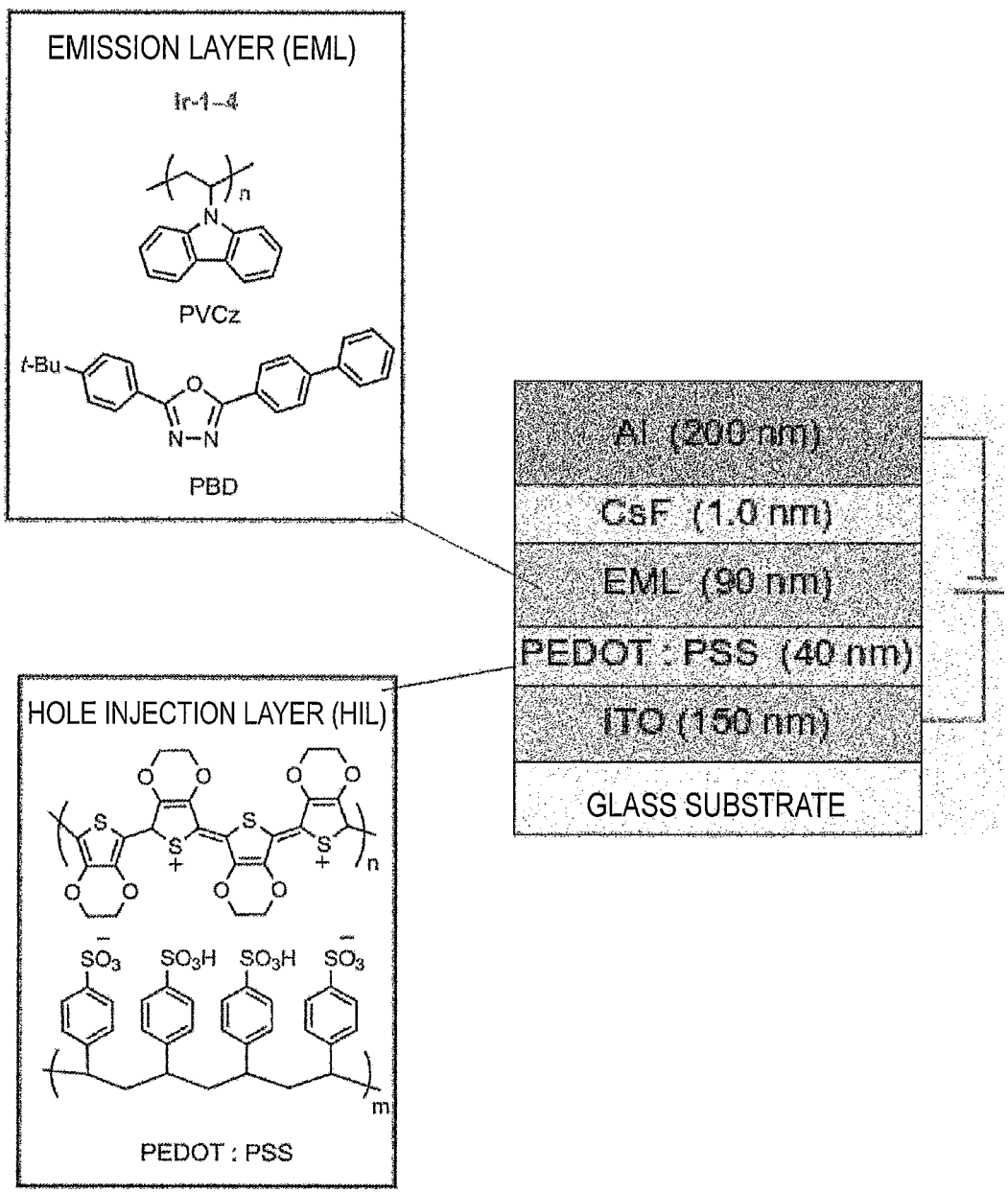
FIG. 4 is a diagram explaining a structure of an OLED produced in the present embodiment.

The structure of the OLED produced in the present embodiment is illustrated in FIG. 4. In the production of the OLED, on a glass substrate (20×25 mm) having an anode (ITO) deposited thereon, PEDOT:PSS (poly(3,4-ethylenedioxythiophene)-poly(styrene sulfonate)) dissolved in isopropyl alcohol/water=1/1 (v/v) was applied, as a hole injection layer, by spin coating, and the resultant was baked.

Next, each of the organoiridium complexes (Ir-1 to Ir-4) used as a light emitting dopant, PBD (2-(4-t-butylphenyl)-5-(4-biphenylyl)-1,3,4-oxadiazole) used as an electron transport material, and PVCz (poly(N-vinylcarbazole)) used as a hole-transporting host material were mixed in a mass ratio of 0.4:6:10, and a solution of the thus obtained mixture dissolved in toluene was applied by spin coating, and the resultant was baked to form an emission layer.

Then, on the thus formed emission layer, cesium fluoride and aluminum were successively stacked by vacuum deposition to form a cathode. The OLEDs produced through these procedures respectively using Ir-1 to Ir-4 are referred to respectively as Device 1 to Device 4.

<Evaluation of OLED Properties>

Each of the OLEDs (Device 1 to Device 4) obtained through the aforementioned procedures was sealed with a slide glass and a UV curable epoxy resin to produce a sample for evaluation of organic EL properties. Then, the electroluminescent properties were evaluated. In the present embodiment, the OLED properties of each Device such as the EL spectrum, the maximum luminance $L_{max}$ (cd/m$^2$), the maximum external quantum efficiency $\eta_{ext,max}$ (%), and the CIE standard colorimetric system (x, y) were measured with a luminance goniophotometer (C-9920-11, manufactured by HAMAMATSU Photonics K.K.).

Table 4 shows the results of the luminescence starting voltage $V_{Turn-on}$ (V), the maximum luminance $L_{max}$ (cd/m$^2$), the maximum external quantum efficiency $\eta_{ext,max}$ (%), the maximum current efficiency $\eta_{j,max}$ (cd/A), the maximum power efficiency $\eta_{p,max}$ (lm/W), the peak wavelength $\lambda_{EL}$ (nm) in the EL spectrum, and the CIE (x, y) of each of Device 1 to Device 4. The luminescence starting voltage $V_{Turn-on}$ corresponds to a voltage at which the luminance reaches 1 cd/m$^2$. The $L_{max}$ and the like are shown along with the applied voltage (@V) at the time of the measurement in brackets. Note that the CIE (x, y) corresponds to a CIE chromaticity coordinate of the emitted light at the maximum luminance.

Figure 5:
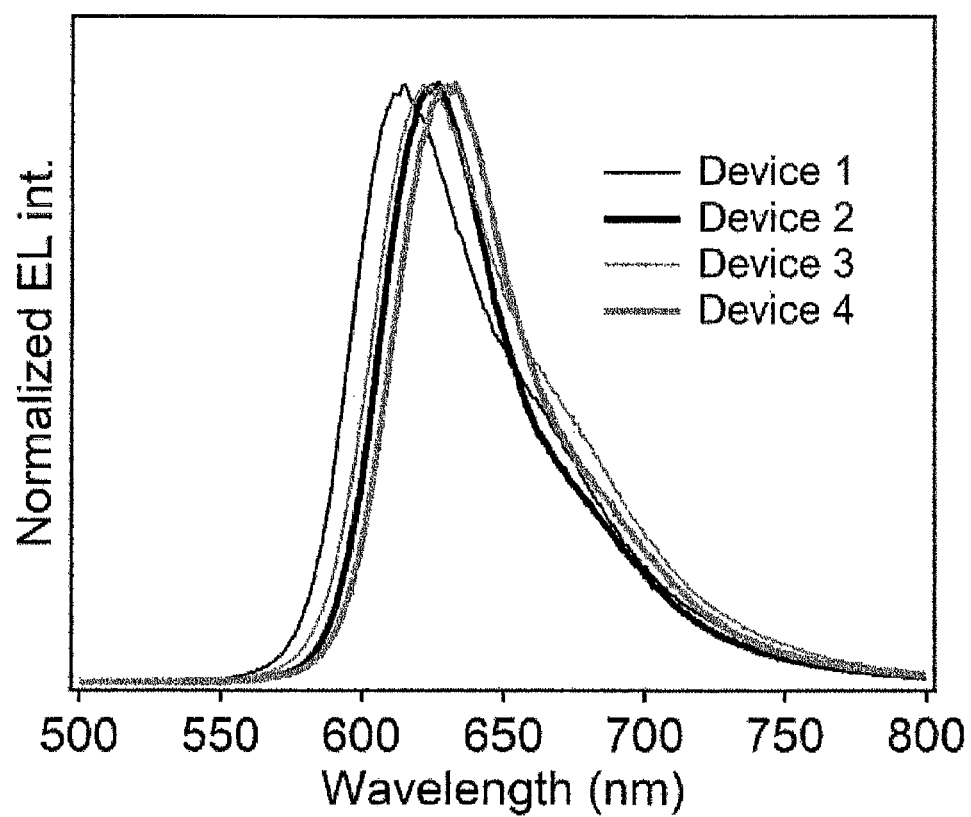
FIG. 5 is a diagram of electroluminescence spectrum of OLEDs (Device 1 to Device 4) produced in the present embodiment.
Figure 6:
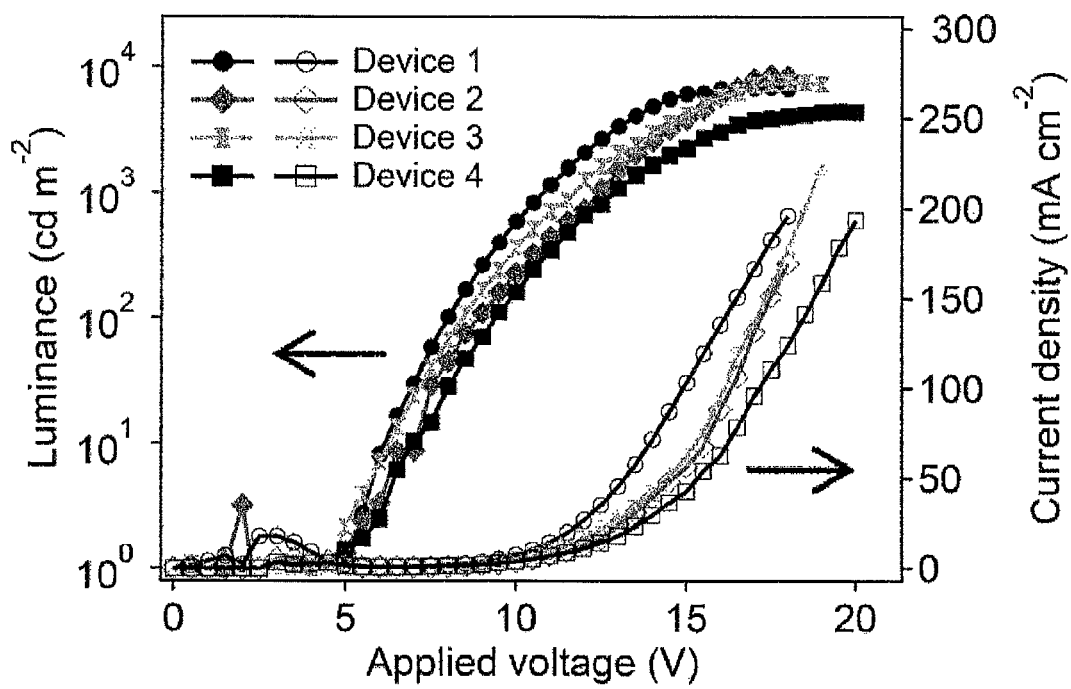
FIG. 6 is a diagram of J-V-L curves of OLEDs (Device 1 to Device 4) produced in the present embodiment.
Figure 7:
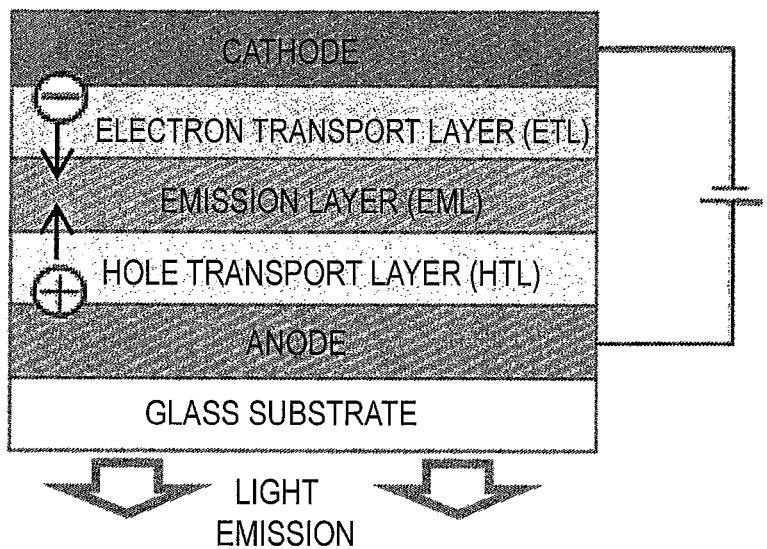
FIG. 7 is a diagram explaining an example of the structure of an OLED.

Besides, FIGS. 5 and 6 illustrate the electroluminescent (EL) spectrum and J-V-L curves measured at the maximum luminance $L_{max}$ of the respective OLED devices.

INDUSTRIAL APPLICABILITY

The present inventive organoiridium complex is a red phosphorescent material having high PL quantum efficiency ($\Phi_{PL}$) and excellent in color purity (red). The present invention is useful as a dopant for red light emission in a display or the like utilizing an organic electroluminescent element.

The invention claimed is:

1. An organoiridium complex for an organic electroluminescent element, comprising a C—N ligand and an ancillary ligand coordinated with iridium, and represented by a following Formula,
wherein a 2-(dibenzo[b,d]thiophen-4-yl)quinolinate ligand having at least one methyl group introduced thereinto is coordinated as the C—N ligand:

Chemical Formula 1

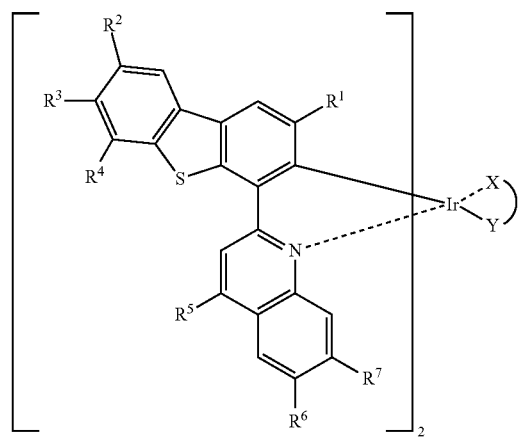

and in "Chemical Formula 1", $R^1$, $R^2$, $R^3$, $R^4$, $R^5$, $R^6$, and $R^7$ are each a methyl group or a hydrogen atom,

TABLE 4

| Device | $V_{turn-on}$ (V) | $L_{max}$ (cd m$^{-2}$) [@V] | $\eta_{ext}$ (%) [@V] | $\eta_j$ (cd A$^{-1}$) [@V] | $\eta_p$ (lm W$^{-1}$) [@V] | $\lambda_{EL}$ (nm) [FWHM] @ $L_{max}$ | CIE (x, y) @ $L_{max}$ |
|---|---|---|---|---|---|---|---|
| Device-1 | 5.5 | 6800 [17.5] | 6.4 [10.5] | 7.9 [10.5] | 2.4 [10.5] | 615 [63] | (0.65, 0.34) |
| Device-2 | 5.0 | 8600 [17.5] | 6.6 [15.0] | 6.7 [15.0] | 2.0 [8.5] | 627 [51] | (0.68, 0.32) |
| Device-3 | 3.5 | 7600 [18.5] | 7.6 [11.0] | 7.5 [12.0] | 2.2 [10.0] | 622 [64] | (0.67, 0.33) |
| Device-4 | 5.0 | 4400 [19.5] | 6.8 [13.0] | 5.9 [13.0] | 1.5 [7.0] | 633 [54] | (0.68, 0.31) |

When the EL spectrum and the electroluminescent wavelengths ($\lambda_{EL}$) were studied, it was revealed that Device 1 to Device 4 exhibited red electroluminescence with the $\lambda_{EL}$ of 615 nm to 633 nm. This result is similar to the aforementioned spectrum obtained in the above organic solvents and in the PMMA thin film. In Device 2 to Device 4 respectively using, as the dopant, the organoiridium complexes (Ir-2 to Ir-4) having a methyl group introduced thereinto, electroluminescence with a longer wavelength was obtained than in Device 1 (Ir-1). The FWHM of the EL spectrum was also narrower. Accordingly, it was confirmed that the organoiridium complexes (Ir-2 to Ir-4) of the present embodiment are effective as the light emitting dopant of an emission layer in an OLED as a red phosphorescent material.

provided that at least one of $R^1$, $R^2$, $R^3$, $R^4$ is a methyl group; and X—Y is the ancillary ligand.

2. The organoiridium complex according to claim 1, wherein $R^1$ is a methyl group, and $R^2$, $R^3$, and $R^4$ are all hydrogen.

3. The organoiridium complex according to claim 1, wherein $R^1$ and $R^3$ are a methyl group, and $R^2$ and $R^4$ are hydrogen.

4. The organoiridium complex according to claim 1, wherein $R^2$ and $R^4$ are a methyl group, and $R^1$ and $R^3$ are hydrogen.

5. The organoiridium complex according to claim 1, wherein $R^1$, $R^2$ and $R^4$ are all a methyl group, and $R^3$ is hydrogen.

6. The organoiridium complex according to claim 1, wherein the ancillary ligand (X—Y) is any one of the following:

Chemical Formula 2

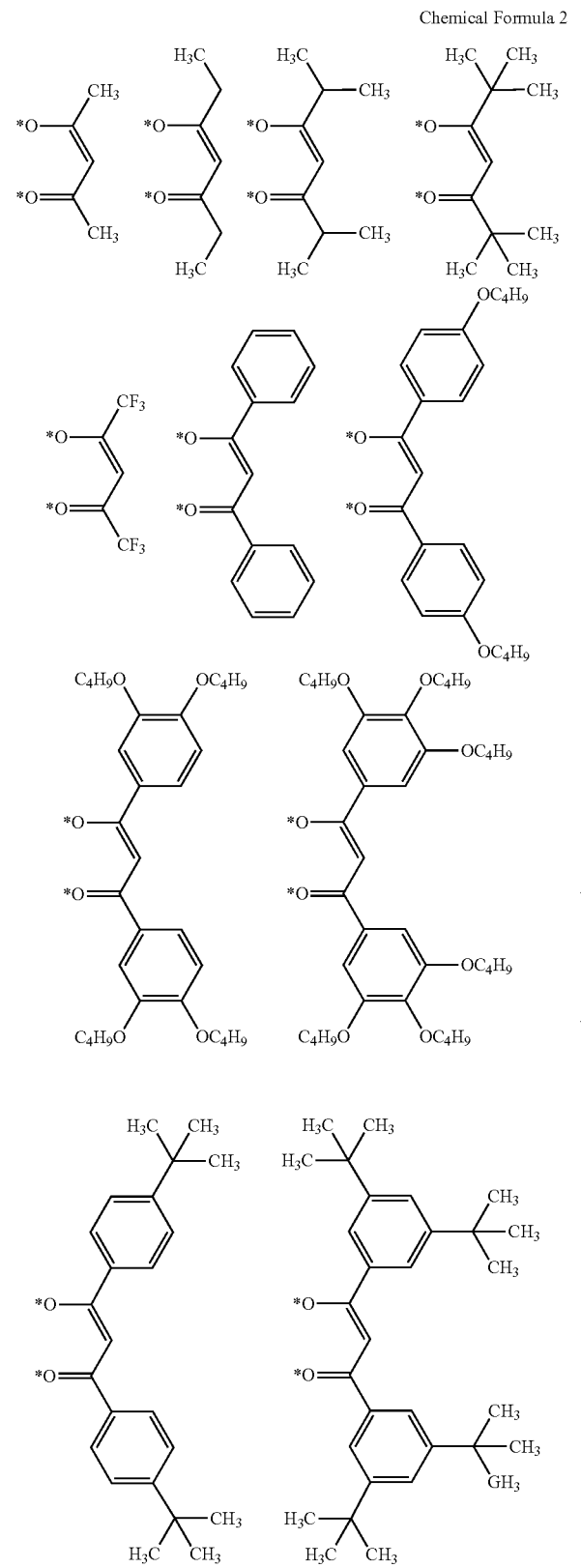
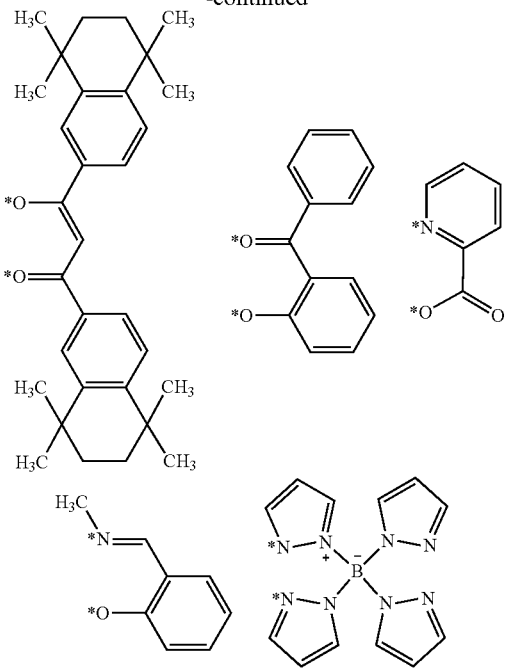

and in "Chemical Formula 2", an atom marked with * is a coordinating atom coordinated with an iridium atom.

7. A method for producing the organoiridium complex according to claim 1, comprising the steps of:
   synthesizing a precursor by reacting an iridium salt with the C—N ligand synthesized by the method for producing the C—N ligand to be coordinated in the organoiridium complex according to claim 1, comprising the steps of:
   (1) synthesizing an intermediate 1 comprising a biphenylamine derivative by reacting dibromoaniline or a dibromoaniline derivative having a methyl group introduced thereinto used as a starting material with a phenylboronic acid derivative or a phenylboronic acid derivative having a methyl group;
   (2) synthesizing an intermediate 2 by iodinating an amino group of the intermediate 1;
   (3) synthesizing an intermediate 3 that is a cyclic dibenzo iodonium compound by oxidizing the intermediate 2 with peroxo acid;
   (4) synthesizing an intermediate 4 that is a bromodibenzothiophene derivative by reacting the intermediate 3 with thioacetate;
   (5) synthesizing an intermediate 5 that is a dibenzothiophene-boronic acid derivative having 1 or more methyl groups introduced thereinto by reacting the intermediate 4 with a boronic acid ester; and
   (6) reacting the intermediate 5 with 2-chloroquinoline or a 2-chloroquinoline derivative; and
   synthesizing the organoiridium complex by reacting the precursor with the ancillary ligand.

8. An organic electroluminescent element, comprising an emission layer doped with the organoiridium complex according to claim 1.

9. The organoiridium complex according to claim 2, wherein the ancillary ligand (X—Y) is any one of the following:

Chemical Formula 2
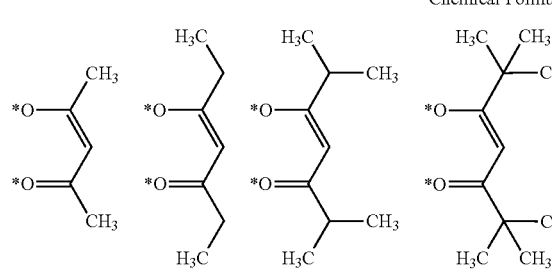
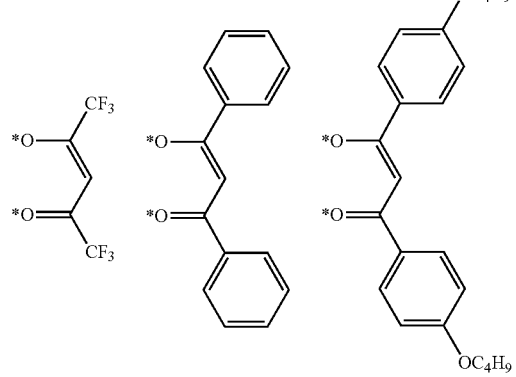
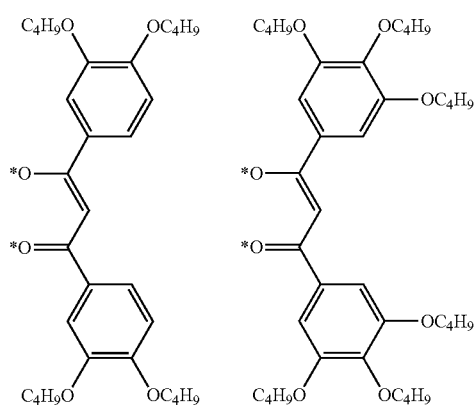
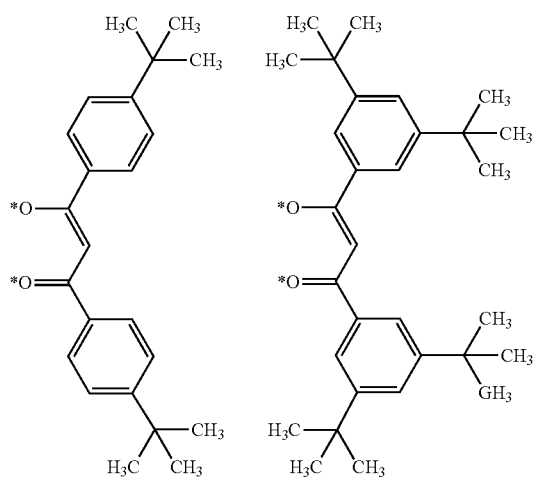
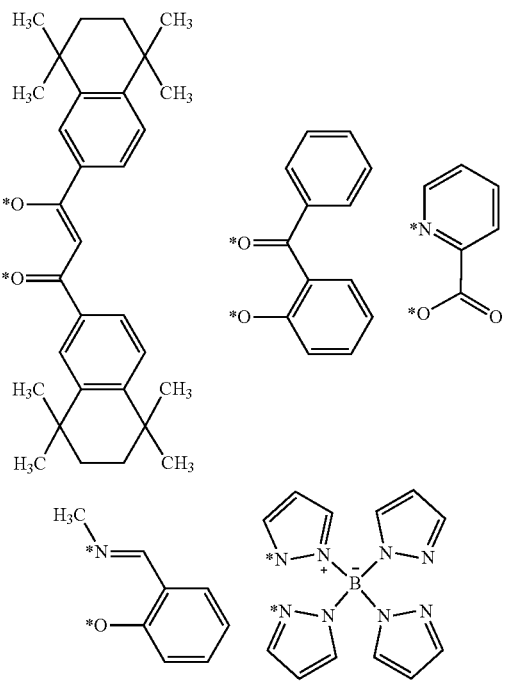
and in "Chemical Formula 2", an atom marked with * is a coordinating atom coordinated with an iridium atom.
10. The organoiridium complex according to claim 3, wherein the ancillary ligand (X—Y) is any one of the following:
Chemical Formula 2
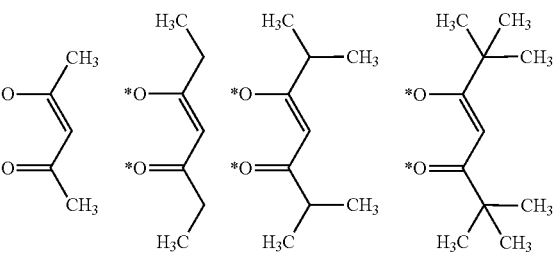
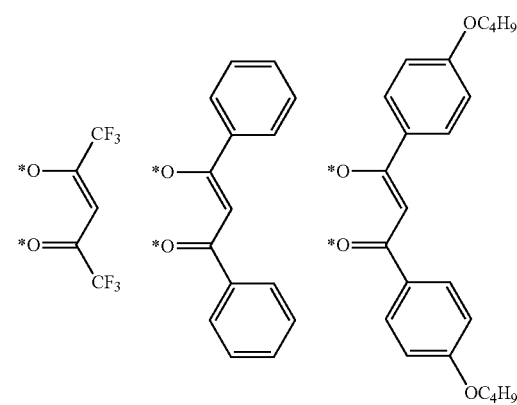

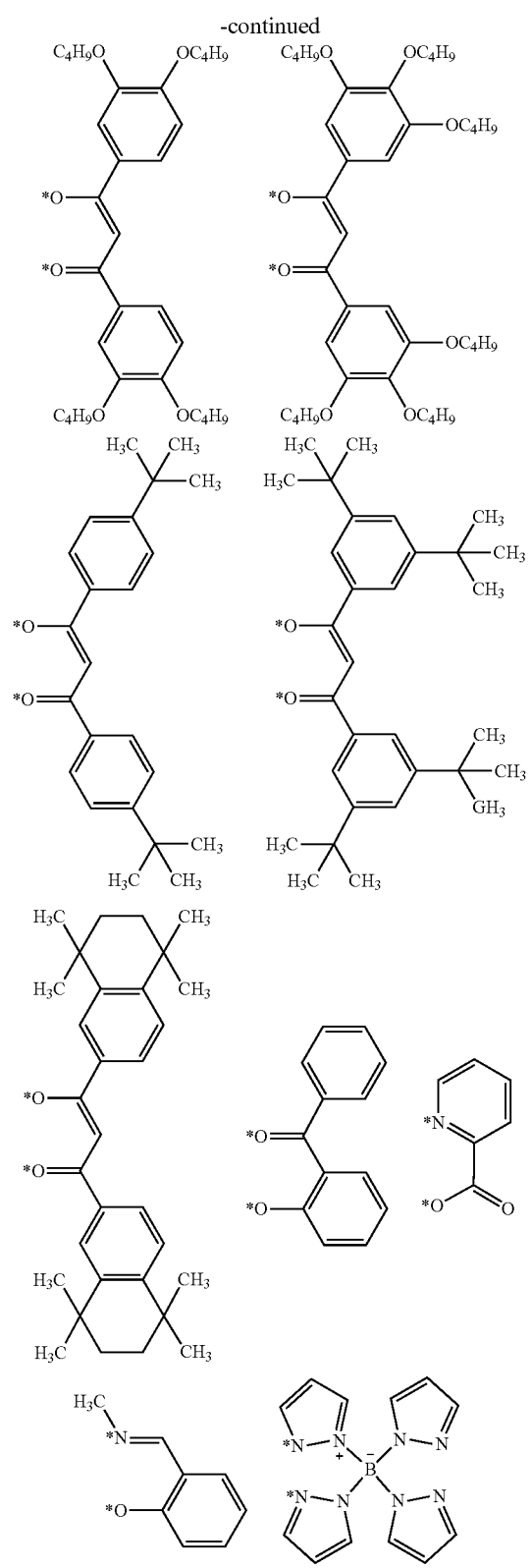
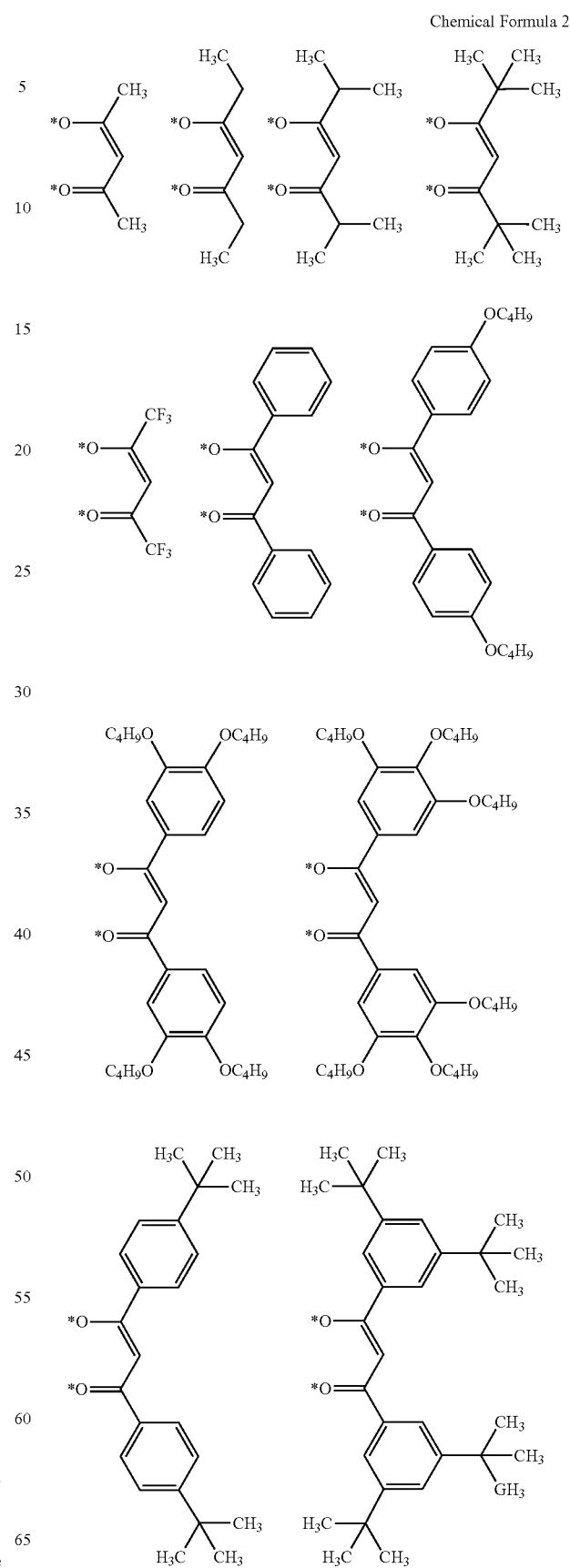
and in "Chemical Formula 2", an atom marked with * is a coordinating atom coordinated with an iridium atom.
11. The organoiridium complex according to claim 4, wherein the ancillary ligand (X—Y) is any one of the following:

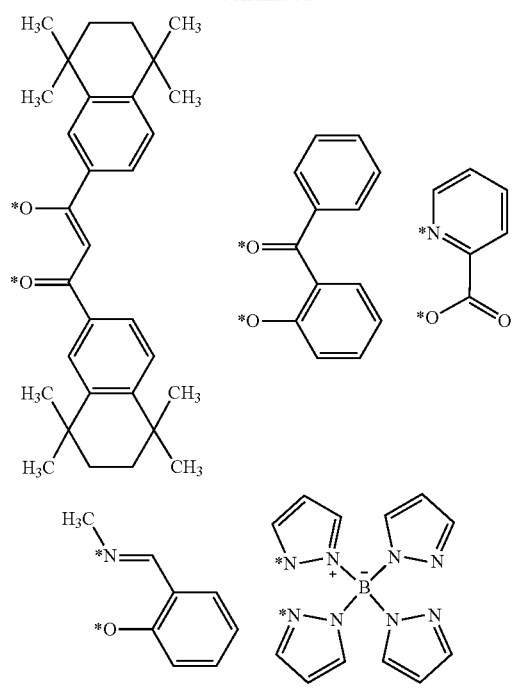

and in "Chemical Formula 2", an atom marked with * is a coordinating atom coordinated with an iridium atom.

12. The organoiridium complex according to claim 5, wherein the ancillary ligand (X—Y) is any one of the following:

and in "Chemical Formula 2", an atom marked with * is a coordinating atom coordinated with an iridium atom.

13. A method for producing the C—N ligand to be coordinated in the organoiridium complex according to claim 2, comprising the steps of:

(1) synthesizing an intermediate 1 comprising a biphenylamine derivative by reacting dibromoaniline or a dibromoaniline derivative having a methyl group introduced thereinto used as a starting material with a phenylboronic acid derivative or a phenylboronic acid derivative having a methyl group;

(2) synthesizing an intermediate 2 by iodinating an amino group of the intermediate 1;

(3) synthesizing an intermediate 3 that is a cyclic dibenzo iodonium compound by oxidizing the intermediate 2 with peroxo acid;

(4) synthesizing an intermediate 4 that is a bromodibenzothiophene derivative by reacting the intermediate 3 with thioacetate;

(5) synthesizing an intermediate 5 that is a dibenzothiophene-boronic acid derivative having 1 or more methyl groups introduced thereinto by reacting the intermediate 4 with a boronic acid ester; and (6) reacting the intermediate 5 with 2-chloroquinoline or a 2-chloroquinoline derivative.

14. A method for producing the C—N ligand to be coordinated in the organoiridium complex according to claim 3, comprising the steps of:

(1) synthesizing an intermediate 1 comprising a biphenylamine derivative by reacting dibromoaniline or a dibromoaniline derivative having a methyl group introduced thereinto used as a starting material with a phenylboronic acid derivative or a phenylboronic acid derivative having a methyl group;

(2) synthesizing an intermediate 2 by iodinating an amino group of the intermediate 1;

(3) synthesizing an intermediate 3 that is a cyclic dibenzo iodonium compound by oxidizing the intermediate 2 with peroxo acid;

(4) synthesizing an intermediate 4 that is a bromodibenzothiophene derivative by reacting the intermediate 3 with thioacetate;

(5) synthesizing an intermediate 5 that is a dibenzothiophene-boronic acid derivative having 1 or more methyl groups introduced thereinto by reacting the intermediate 4 with a boronic acid ester; and (6) reacting the intermediate 5 with 2-chloroquinoline or a 2-chloroquinoline derivative.

15. A method for producing the C—N ligand to be coordinated in the organoiridium complex according to claim 4, comprising the steps of:

(1) synthesizing an intermediate 1 comprising a biphenylamine derivative by reacting dibromoaniline or a dibromoaniline derivative having a methyl group introduced thereinto used as a starting material with a phenylboronic acid derivative or a phenylboronic acid derivative having a methyl group;

(2) synthesizing an intermediate 2 by iodinating an amino group of the intermediate 1;

(3) synthesizing an intermediate 3 that is a cyclic dibenzo iodonium compound by oxidizing the intermediate 2 with peroxo acid;

(4) synthesizing an intermediate 4 that is a bromodibenzothiophene derivative by reacting the intermediate 3 with thioacetate;

(5) synthesizing an intermediate 5 that is a dibenzothiophene-boronic acid derivative having 1 or more methyl groups introduced thereinto by reacting the intermediate 4 with a boronic acid ester; and (6) reacting the intermediate 5 with 2-chloroquinoline or a 2-chloroquinoline derivative.

16. A method for producing the C—N ligand to be coordinated in the organoiridium complex according to claim 5, comprising the steps of:

(1) synthesizing an intermediate 1 comprising a biphenylamine derivative by reacting dibromoaniline or a dibromoaniline derivative having a methyl group introduced thereinto used as a starting material with a phenylboronic acid derivative or a phenylboronic acid derivative having a methyl group;

(2) synthesizing an intermediate 2 by iodinating an amino group of the intermediate 1;

(3) synthesizing an intermediate 3 that is a cyclic dibenzo iodonium compound by oxidizing the intermediate 2 with peroxo acid;

(4) synthesizing an intermediate 4 that is a bromodibenzothiophene derivative by reacting the intermediate 3 with thioacetate;

(5) synthesizing an intermediate 5 that is a dibenzothiophene-boronic acid derivative having 1 or more methyl groups introduced thereinto by reacting the intermediate 4 with a boronic acid ester; and (6) reacting the intermediate 5 with 2-chloroquinoline or a 2-chloroquinoline derivative.

17. A method for producing the C—N ligand to be coordinated in the organoiridium complex according to claim 6, comprising the steps of:

(1) synthesizing an intermediate 1 comprising a biphenylamine derivative by reacting dibromoaniline or a dibromoaniline derivative having a methyl group introduced thereinto used as a starting material with a phenylboronic acid derivative or a phenylboronic acid derivative having a methyl group;

(2) synthesizing an intermediate 2 by iodinating an amino group of the intermediate 1;

(3) synthesizing an intermediate 3 that is a cyclic dibenzo iodonium compound by oxidizing the intermediate 2 with peroxo acid;

(4) synthesizing an intermediate 4 that is a bromodibenzothiophene derivative by reacting the intermediate 3 with thioacetate;

(5) synthesizing an intermediate 5 that is a dibenzothiophene-boronic acid derivative having 1 or more methyl groups introduced thereinto by reacting the intermediate 4 with a boronic acid ester; and (6) reacting the intermediate 5 with 2-chloroquinoline or a 2-chloroquinoline derivative.

18. An organic electroluminescent element, comprising an emission layer doped with the organoiridium complex according to claim 2.

19. An organic electroluminescent element, comprising an emission layer doped with the organoiridium complex according to claim 3.

* * * * *